(12) United States Patent
Miyata et al.

(10) Patent No.: US 10,886,321 B2
(45) Date of Patent: Jan. 5, 2021

(54) COLOR IMAGE-CAPTURE ELEMENT AND IMAGE CAPTURE DEVICE

(71) Applicant: NIPPON TELEGRAPH AND TELEPHONE CORPORATION, Tokyo (JP)

(72) Inventors: Masashi Miyata, Tokyo (JP); Mitsumasa Nakajima, Tokyo (JP); Toshikazu Hashimoto, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 16/804,393

(22) Filed: Feb. 28, 2020

(65) Prior Publication Data

US 2020/0266230 A1    Aug. 20, 2020

Related U.S. Application Data

(63) Continuation of application No. PCT/JP2019/011138, filed on Mar. 18, 2019.

(30) Foreign Application Priority Data

Apr. 17, 2018    (JP) .................................. 2018-079444

(51) Int. Cl.
H01L 27/146    (2006.01)

(52) U.S. Cl.
CPC .. *H01L 27/14645* (2013.01); *H01L 27/14621* (2013.01); *H01L 27/14627* (2013.01); *H01L 27/14629* (2013.01); *H01L 27/14685* (2013.01)

(58) Field of Classification Search
CPC ......... H01L 27/14645; H01L 27/14621; H01L 27/14627; H01L 27/14629; H01L 27/14685

(Continued)

(56) References Cited

U.S. PATENT DOCUMENTS

2010/0176473 A1    7/2010    Nishiwaki
2010/0188537 A1    7/2010    Hiramoto et al.
(Continued)

FOREIGN PATENT DOCUMENTS

JP    201249620    3/2012
WO    2009019818    2/2009
(Continued)

OTHER PUBLICATIONS

Seiji Nishiwaki, et al.; "Efficient Colour Splitters for High-Pixel-Density Image Sensors"; Nature Photonics; vol. 7; Mar. 2013; pp. 240-246.

(Continued)

*Primary Examiner* — Tong-Ho Kim
(74) *Attorney, Agent, or Firm* — Workman Nydegger

(57) ABSTRACT

Provided is a highly-sensitive color image-capture element and an image capture device that can be simply manufactured, have little polarization dependency, and have micro-spectroscopic elements capable of separating incident light into three wavelength ranges integrated facing a two-dimensional pixel array. An image capture element 100 has a transparent layer 111 having a low refractive index made of $SiO_2$ or the like and a plurality of micro-lenses 103 laminated on a two-dimensional pixel array in which pixels 102 each including a photoelectric conversion element are disposed in an array. Inside the transparent layer 111 having the low refractive index, micro-spectroscopic elements 101 composed of a plurality of microstructures having constant thickness (length in a direction perpendicular to the two-dimensional pixel array) formed of a material such as SiN having a higher refractive index than that of the transparent layer 111 is embedded.

8 Claims, 18 Drawing Sheets

(58) Field of Classification Search
USPC .......................................................... 257/432
See application file for complete search history.

(56) References Cited

U.S. PATENT DOCUMENTS

| | | | |
|---|---|---|---|
| 2011/0037869 A1 | 2/2011 | Hiramoto et al. | |
| 2011/0192962 A1 | 8/2011 | Nishiwaki et al. | |
| 2012/0212656 A1 | 8/2012 | Hiramoto et al. | |
| 2014/0124650 A1 | 5/2014 | Nakamura et al. | |
| 2014/0284455 A1 | 9/2014 | Hiramoto et al. | |
| 2017/0090206 A1* | 3/2017 | Kim | G02B 27/1073 |

FOREIGN PATENT DOCUMENTS

| | | |
|---|---|---|
| WO | 2009153937 | 12/2009 |
| WO | 2010016195 | 2/2010 |
| WO | 2010070869 | 6/2010 |
| WO | 2013094178 | 6/2013 |
| WO | 2014033976 | 3/2014 |

OTHER PUBLICATIONS

Japan Patent Office, English Translation of International Search Report in International Application No. PCT/JP2019/011138, dated Nov. 6, 2019, 2 pages.

* cited by examiner

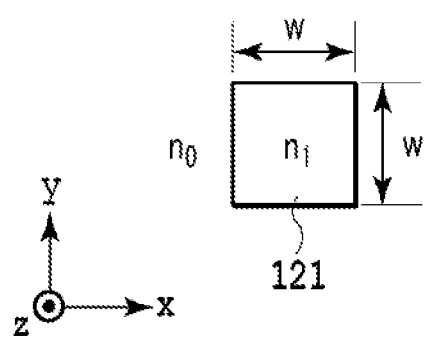
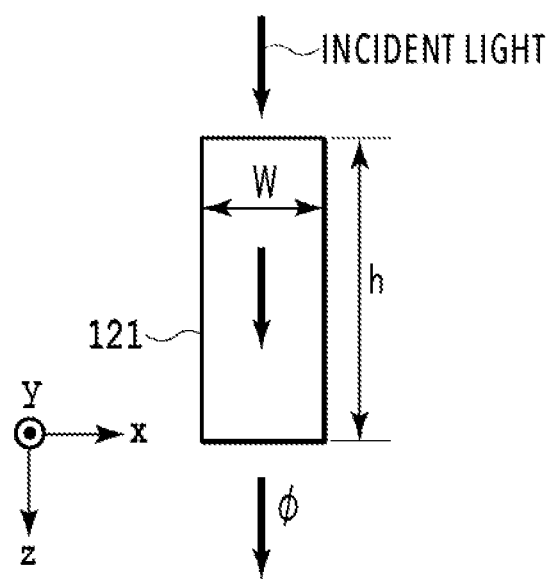
FIG.4A  FIG.4B

COLOR IMAGE-CAPTURE ELEMENT AND IMAGE CAPTURE DEVICE

TECHNICAL FIELD

The present invention relates to a color image-capture element and an image capture device including the color image-capture element.

BACKGROUND ART

In general, in an image capture element including a photoelectric conversion element such as a CCD (Charge Coupled Device) sensor or a COMS (Complementary Metal Oxide Semiconductor) sensor, it is required to perform color separation of incident light in order to obtain color information on an imaging subject.

FIG. 16 shows a sectional view of a conventional color image-capture element. In a conventional color image-capture element 600, a photoelectric conversion element 602 is disposed on an electric wiring 601, and a color subtractive-type color filter 604 made of an organic material or an inorganic multilayer film material is disposed to face each pixel including the photoelectric conversion element 602. A micro-lens 605 is disposed on the color filter 604.

When light enters from the micro-lens 605, the color filter 604 is used to transmit light only in a desired wavelength band but to absorb or reflect light in an unnecessary wavelength band. From three photoelectric conversion elements 602 corresponding to red (R), green (G), and blue (B), each signal is thereby acquired for each pixel, and a color two-dimensional image can be generated.

However, in the general color image-capture element 600 as described above, there is a problem in that if the ratio of RGB of incident light is 1:1:1, the total quantity of light after passing through the color filters 604 inevitably becomes about ⅓. The remaining lost light constitutes loss due to absorption or reflection, and cannot reach the photoelectric conversion element 602. Consequently, the light utilization efficiency of incident light is about 30% at the maximum and the sensitivity of the image capture element is greatly limited. In recent years when pixel miniaturization has been progressing, the quantity of light received by one pixel has decreased, and solving the above-described problem is desired.

For this reason, it has been proposed to form a color image-capture element by using a spectroscopic element such as a micro-prism or a dichroic mirror capable of branching incident light according to a wavelength band instead of the color filter 604. By such an approach, in principle, the loss of incident light is greatly reduced, and the light utilization efficiency can be greatly improved. However, in recent years when pixel miniaturization has been progressing, it is difficult to integrate elements as described above on the photoelectric conversion element.

Therefore, in recent years, it has been proposed to form a color image-capture element by using a spectroscopic element composed of a microstructure that is relatively easy to integrate on the photoelectric conversion element. Non Patent Literature 1 proposes a method of using two types of microstructures capable of separating incident light into two wavelength ranges, thereby eliminating light loss in color separation in principle, and improving light utilization efficiency.

FIG. 17A shows a top view of a color image-capture element using a conventional spectroscopic element, FIG. 17B shows a sectional view along XVIIb-XVIIb thereof, and FIG. 17C shows sectional view along XVIIc-XVIIc thereof. As shown in the FIGS. 17A-C, a color image-capture element 610 separates incident light into light traveling straight and deflecting light according to wavelength ranges by micro-beam structures 606-1 and 606-2 disposed correspondingly to a pixel 602 instead of the color filter 604. This is because inside the micro-beam structures and around them, phase delay effects perceived by the incident light are greatly different in one wavelength range and almost equal in the other wavelength range.

Therefore, by alternately arranging two types of micro-beam structures 606-1 and 606-2 having different structure thickness for each row on a two-dimensional pixel array, four photoelectric conversion elements 602 adjacent to each other are enabled to receive light having wavelength components different from each other. As a result, color information can be generated by matrix calculation using a photoelectric conversion signal output from each photoelectric conversion element 602.

Furthermore, at the same time, Non Patent Literature 1 also proposes a color image-capture element 620 that improves optical utilization efficiency by arranging a step-shaped microstructure 607 capable of separating incident light into three wavelength ranges above the pixels 602 as shown in FIG. 18. Since this method can cause the separated lights in the three wavelength ranges to respectively enter the three adjacent photoelectric conversion elements 602 in addition to color information generation by matrix calculation as described above, it is considered that color information can be directly generated using the photoelectric conversion signal output from each photoelectric conversion element 602.

CITATION LIST

Non Patent Literature

[Non Patent Literature 1] Seiji Nishiwaki, Tatsuya Nakamura, Masao Hiramoto, Toshiya Fujii and Masa-aki Suzuki, "Efficient colour splitters for high-pixel-density image sensors," Nature Photonics, Vol. 7, March 2013, pp. 240-246

SUMMARY OF INVENTION

Technical Problem

However, the techniques disclosed in Non Patent Literature 1 have practical problems.

First, in the method of using the microstructures 606-1 and 606-2 that separate incident light into two wavelength ranges, since structure heights of the two types of microstructures 606-1 and 606-2 are different from each other, costs in a manufacturing process increase. In addition, since the shapes of the microstructures 606-1 and 606-2 are beam structures having a long axis, there is a problem in that a phase delay effect perceived by the light differs depending on the polarization direction of the incident light and a color separation function has polarization dependency. Furthermore, since signal processing is performed from light intensity data separated into two sets of two wavelength ranges and RGB information is restored, there is a concern about color reproducibility.

On the other hand, according to the method of using the step-shaped microstructure 607 that separates incident light into three wavelength ranges, a color image with a high light utilization ratio and good color reproducibility can be certainly obtained theoretically, but it is difficult to manufacture a microstructure 607 having ideal spectral characteristics. The step-shaped microstructure 607 disclosed requires highly accurate positioning techniques in lithography processes in addition to requiring multiple times of lithography and etching processes, causing a problem of an increase in manufacturing costs. Since the shape of the microstructure 607 is a beam structure having a long axis in the same manner as the microstructures 606-1 and 606-2 that separate incident light into two wavelength ranges, there is a problem in that a color separation function has polarization dependency.

The present invention has been made in view of the above problems, and an object of the present invention is to provide a highly-sensitive color image-capture element and an image capture device that can be simply manufactured, have little polarization dependency, and have micro-spectroscopic elements capable of separating incident light into three wavelength ranges integrated facing a two-dimensional pixel array.

Solution to Problem

In order to solve the above problems, one aspect of the present invention is a color image-capture element that includes a two-dimensional pixel array in which a plurality of pixels each including a photoelectric conversion element are disposed on a substrate in a two-dimensional array, a transparent layer formed on the two-dimensional pixel array, and a two-dimensional spectroscopic element array in which a plurality of spectroscopic elements are disposed inside or on the transparent layer in a two-dimensional array, wherein each of the spectroscopic elements includes a set of microstructures composed of a plurality of microstructures formed of a material having a higher refractive index than a refractive index of the transparent layer, wherein the set of microstructures is composed of the plurality of microstructures that have equal length in a direction perpendicular to the two-dimensional pixel array but have a different shape in a horizontal direction with respect to the two-dimensional pixel array, and are disposed at intervals equal to or shorter than a wavelength of incident light, wherein at least part of light incident on the spectroscopic elements is separated into first to third deflected lights that have different propagation directions according to their respective wavelengths, and the lights are emitted from the spectroscopic elements, and enter the three respective pixels disposed consecutively in one direction of the two-dimensional pixel array.

In another aspect of the present invention, each of the microstructures is a columnar structure, bottom and top surfaces of which structure have a shape of a four-fold rotational symmetry with a center as an axis of symmetry.

In another aspect of the present invention, the first to third deflected lights are incident on first to third photoelectric conversion elements of adjacent three consecutive pixels, respectively.

In another aspect of the present invention, when incident light is white light, light incident on the first photoelectric conversion element has a light intensity peak in a blue wavelength region of 500 nm or less, light incident on the second photoelectric conversion element has a light intensity peak in a green wavelength region from 500 nm to 600 nm, and light incident on the third photoelectric conversion element has a light intensity peak in a red wavelength region of 600 nm or more.

In another aspect of the present invention, a shape of the set of microstructures is identical in all the spectroscopic elements included in the two-dimensional spectroscopic element array.

In another aspect of the present invention, a direction of the set of microstructures of the adjacent spectroscopic elements disposed along a first direction of the two-dimensional spectroscopic element array is alternately reversed, the adjacent three consecutive pixels are disposed along the first direction, and on the two pixels on outer sides among the three consecutive pixels adjacent along the first direction, any of the first to third deflected lights from the two spectroscopic elements adjacent along the first direction is incident.

In another aspect of the present invention, between the two-dimensional pixel array and the two-dimensional spectroscopic element array, a color filter array is further included in which color filters of at least one of the following types are disposed in an array: a first color filter having a transmittance peak in a blue wavelength region of 500 nm or less; a second color filter having a transmittance peak in a green wavelength region from 500 nm to 600 nm; and a third color filter having a transmittance peak in a red wavelength region of 600 nm or more.

In another aspect of the present invention, an image capture device includes the color image-capture element of one aspect of the present invention, an image capture optical system for forming an optical image on an image capture surface of the color image-capture element, and a signal processing unit that processes an electric signal output by the color image-capture element.

Advantageous Effects of Invention

According to the present invention, it is possible to manufacture a color image-capture element and an image capture device having a high light utilization ratio more simply than before by using micro-spectroscopic elements that can be simply manufactured, have little polarization dependency, and can separate incident light into three wavelength ranges.

BRIEF DESCRIPTION OF DRAWINGS

FIG. 4A shows a top view of a columnar structure included in a micro-spectroscopic element in the image capture element according to Embodiment 1 of the present invention, and FIG. 4B shows a sectional view thereof.

DESCRIPTION OF EMBODIMENTS

Hereinafter, embodiments of the present invention will be described in detail with reference to the drawings. However, the following embodiments are merely examples, and it goes without saying that the present invention is not limited to these embodiments.

Figure 1:
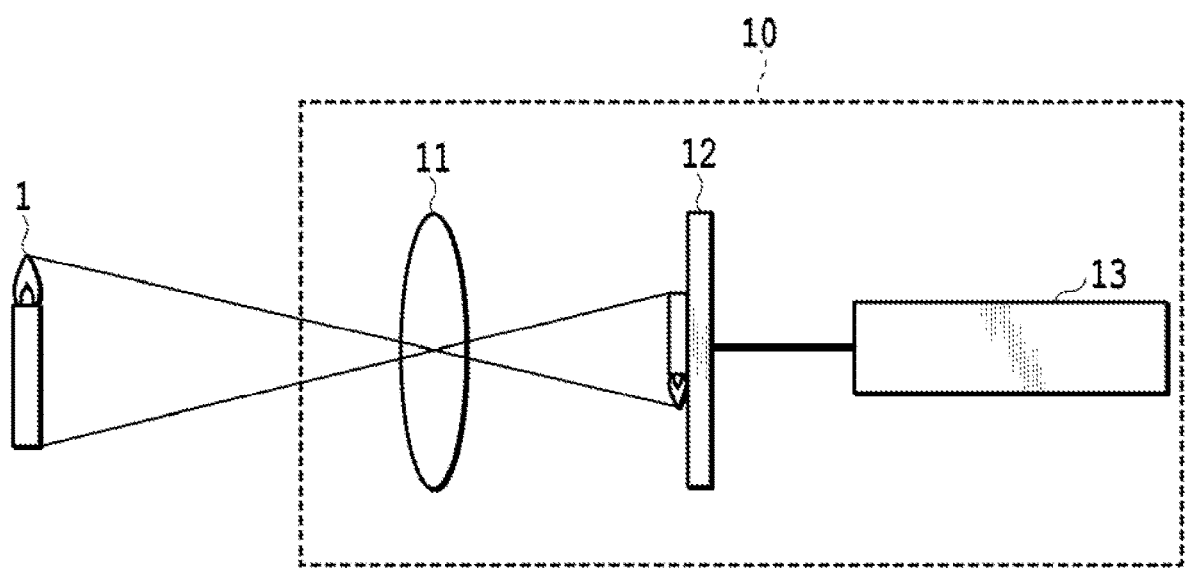
FIG. 1 is a side view showing a schematic configuration of an image capture device of the present invention.

FIG. 1 is a side view showing a schematic configuration of an image capture device of the present invention. An image capture device 10 includes a lens optical system 11, an image capture element 12 including a photoelectric conversion element such as a CCD or a CMOS, and a signal processing unit 13 that processes a photoelectric conversion signal output from the image capture element 12 to generate an image signal.

Light such as natural light or illumination light enters an object 1, and light that has passed through/is reflected by/is scattered by the object, or light generated by the object 1 forms an optical image on the image capture element 12 by the lens optical system 11. Although generally, the lens optical system 11 includes a lens group composed of a plurality of lenses disposed along an optical axis in order to correct various optical aberrations, FIG. 1 shows it as a single lens by simplifying the drawing. In addition, the signal processing unit 13 includes an image signal output that outputs the generated image signal to the outside.

The image capture device 10 of the present invention can include known components such as an optical filter for infrared cut, an electronic shutter, a view finder, a power supply (battery), and a flash light, but descriptions of those are not particularly necessary for understanding the present invention and will be omitted. In addition, the above configuration is merely an example, and in the present invention, known elements can be appropriately combined and used for components excluding the lens optical system 11, image capture element 12, and signal processing unit 13.

An outline of the image capture element 12 in the embodiments of the present invention will be described before describing the specific embodiments of the present invention.

Figure 2:
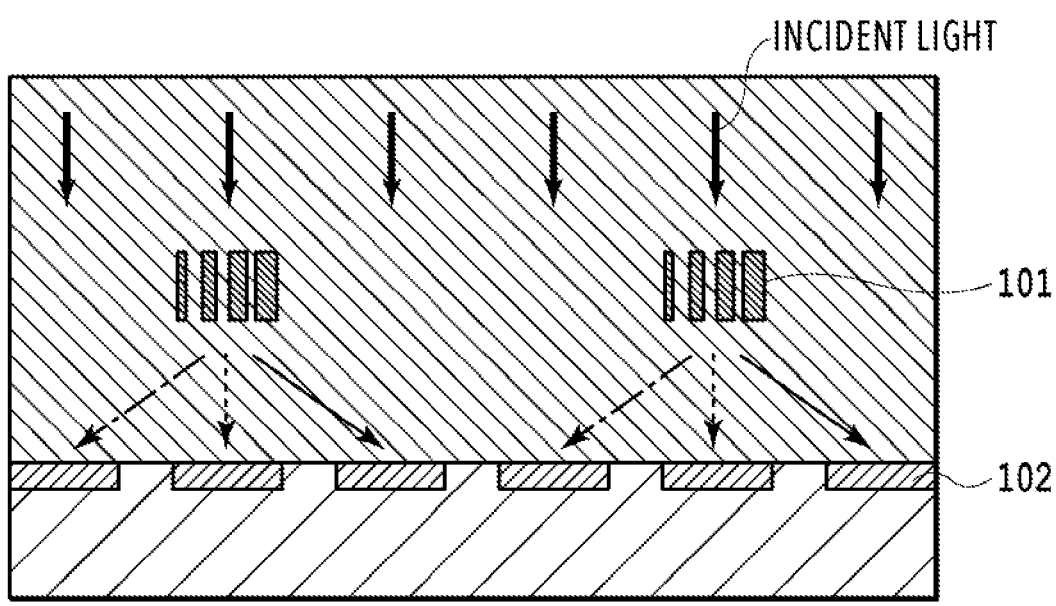
FIG. 2 is a diagram schematically showing a part of a cross section of a pixel array and a spectroscopic element array in an image capture element according to Embodiment 1 of the present invention.

The image capture element 12 by the embodiments of the present invention includes a pixel array in which a plurality of cells (pixels) 102 each including a photoelectric conversion element are two-dimensionally disposed and a spectroscopic element array in which a plurality of micro-spectroscopic elements 101 are two-dimensionally disposed. FIG. 2 is a diagram schematically showing a part of a cross section of a pixel array and a spectroscopic element array in an image capture element according to Embodiment 1 of the present invention. The spectroscopic element array faces the pixel array and is disposed on a side where light from the lens optical system enters. Each micro-spectroscopic element 101 includes a plurality of columnar structures having constant thickness. Note that although the micro-spectroscopic element 101 is represented by four columnar structures for the sake of convenience, the number, interval, arrangement pattern are not limited, and various arrangement forms can be taken.

A visible light component included in light incident on the image capture element 12 is classified into a first color component, a second color component, and a third color component for each wavelength range. Note that combination of the first to third color components is generally a combination of the three primary colors of red (R), green (G), and blue (B), but is not limited to this as long as the light is divided into three wavelength regions.

The micro-spectroscopic element 101 according to the embodiments of the present invention has a function that changes a propagation direction of incident light according to the above-described first to third color components by using a phase delay effect and its structure and dimension dependency and wavelength dependency described later, and thereby spatially separates the light above the pixel array. That is, in the embodiments of the present invention, at least part of light incident on the image capture element changes the propagation directions according to the color components with the micro-spectroscopic element 101 and enters the plurality of pixels 102. Therefore, by appropriately setting the distance between the micro-spectroscopic element 101 and pixels 102, the lights separated into the three wavelength regions can be received by the pixels 102 different from each other.

When light enters the pixel 102, an electric signal (photoelectric conversion signal) corresponding to the intensity of the incident light is output by the photoelectric conversion element, so that a signal (color information) corresponding to a color component can be obtained directly or by using signal calculation. Since the micro-spectroscopic elements 101 described above and the plurality of pixels 102 corresponding to the micro-spectroscopic elements 101 are two-dimensionally disposed, color information on an optical image of the object formed by the lens optical system 11 can be obtained.

Regarding Embodiment 1 and Embodiment 2 described later, since almost all of incident light passes through any of the micro-spectroscopic elements 101 constituting the spectroscopic element array by using a micro-lens array, almost all of the incident light enters the pixel array in the state of being separated into three wavelength regions. Therefore, the color information can be obtained directly or by using simple calculation from the photoelectric conversion signal.

Regarding Embodiment 3 and Embodiment 4 described later, since a part of incident light passes through the micro-spectroscopic elements 101 constituting the spectroscopic element array, a part of the incident light enters the pixel array in the state of being separated into three wavelength regions. Therefore, a part of the pixels 102 outputs a photoelectric conversion signal corresponding to the combined light intensity of light in the state of being separated into three wavelength regions and light in the state of being not separated. The color information can be obtained by using appropriate matrix calculation described later for the output photoelectric conversion signal.

According to the image capture element 12 according to the embodiments of the present invention, it is possible to obtain the color information by low loss light separation into three colors by using the micro-spectroscopic elements 101 without using color subtractive-type color filters. Therefore, as compared with an image capture element using color filters, it is possible to increase the total quantity of light reaching the pixel array and increase image capturing sensitivity. Furthermore, since the micro-spectroscopic element 101 includes structures having constant thickness that is simple to manufacture and polarization dependency does not occur due to symmetry of the structures' top and bottom surfaces, it is possible to solve the problem in that the color separation function of the conventional techniques disclosed in Non Patent Literature 1 has polarization dependency.

Hereinafter, the more specific embodiments of the present invention will be described with reference to the drawings.

Embodiment 1

Figure 3A:
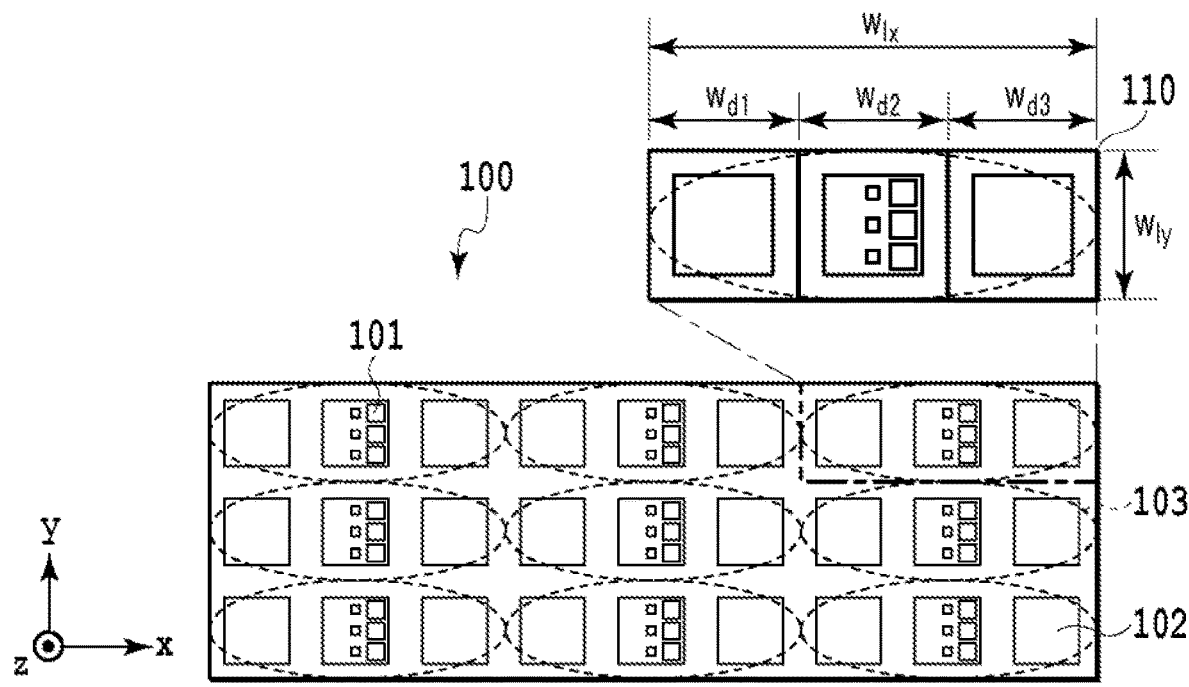
FIG. 3A shows a top view of a schematic configuration of a part of the image capture element according to Embodiment 1 of the present invention.
Figure 3B:
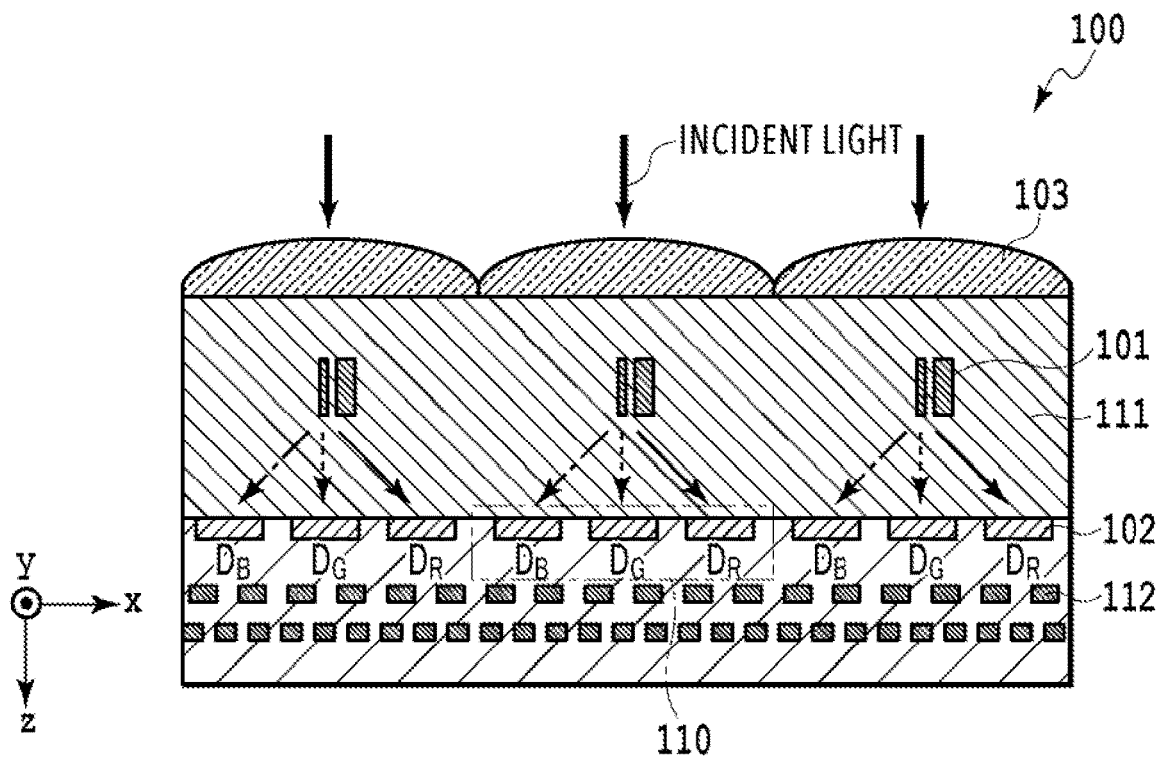
FIG. 3B shows a sectional view thereof.

Hereinafter, an outline of a configuration of an image capture element according to Embodiment 1 will be described FIG. 3A is a top view of a schematic configuration of a part of the image capture element according to Embodiment 1 of the present invention, and FIG. 3B is a sectional view thereof. An image capture element 100 according to Embodiment 1 has a transparent layer 111 having a low refractive index made of $SiO_2$ or the like and a plurality of micro-lenses 103 laminated on a two-dimensional pixel array in which pixels 102 each including a photoelectric conversion element are disposed in an array. Inside the transparent layer 111 having the low refractive index, micro-spectroscopic elements 101 each including a plurality of microstructures having constant thickness (length in a direction perpendicular to the two-dimensional pixel array) formed of a material such as SiN having a higher refractive index than that of the transparent layer 111 are embedded. For the sake of convenience, in the following description, an xyz orthogonal coordinate system is set in which the normal direction of the two-dimensional pixel array is the z axis, a direction which is parallel to the two-dimensional pixel array and in which three pixels 102 constituting a pixel unit 110 are aligned is the x axis, and a direction parallel to the two-dimensional pixel array and orthogonal to the x axis is the y axis.

As shown in the FIGS. 3A and 3B, the micro-lenses 103, micro-spectroscopic elements 101, and the pixels 102 are disposed in a lattice shape on the xy plane, and one micro-spectroscopic element 101 is disposed on the central axis of each micro-lens 103. Assuming that three pixels adjacent in the x-axis direction are defined as one pixel unit 110, each micro-lens 103 adjacent in the x-axis direction has a one-to-one correspondence to the pixel unit 110, and the central axis of each micro-lens 103 passes through substantially the center of the central pixel 102 of the corresponding pixel unit. That is, one micro-lens 103 and one micro-spectroscopic element 101 correspond to the three pixels 102 adjacent in the x-axis direction, and assuming that the micro-lens 103, micro-spectroscopic element 101, and pixel unit 110 are defined as one image capture element unit, the image capture element units are disposed in a lattice shape on the xy plane.

In the above description, the case of the two-dimensional pixel array disposed in an orthogonal lattice shape is described as an example, the arrangement, shape, size, and the like of the pixels 102 are not limited to the example of FIGS. 3A and 3B, and they may be any known arrangement, shape, and size. Although omitted in FIGS. 3A and 3B, between the two-dimensional pixel array and microstructures, a concavo-convex structure having a high refractive index made of SiN or the like can be included that operates as an inner micro-lens and works to lead light from the micro-spectroscopic element 101 to the photoelectric conversion element in the pixel 102. The structure shown in FIGS. 3A and 3B can be manufactured by known semiconductor manufacturing techniques.

The image capture element 100 shown in FIGS. 3A and 3B has a back-illuminated structure that receives light from the opposite side of a wiring layer 112, but in the embodiment, it is not limited to such a structure, and may have a front-illuminated structure that receives light from the side of the wiring layer 112.

Hereinafter, functions of each component of the image capture element 100 according to the embodiment will be described.

White light incident on the image capture element 100 is first condensed by the micro-lens array, and almost all the light passes through the micro-spectroscopic elements 101 corresponding to the respective micro-lenses 103. The light is spatially separated into three wavelength regions in the xz plane by the micro-spectroscopic elements 101, and is received by the three pixels 102 immediately under each micro-spectroscopic element 101. In an example shown in FIG. 3B, since light (R) of the first color component propagates to a first direction (right), light (G) of the second color component propagates to a second direction (straight forward), and light (B) of the third color component propagates to a third direction (left) by each micro-spectroscopic element 101, the three pixels 102 $D_R$ (right), $D_G$ (center), and $D_B$ (left) immediately under each micro-spectroscopic element 101 correspond to detection of color information on R, G, and B, respectively.

The above is an example, and depending on the configuration of each micro-spectroscopic element 101, a combination of color components and propagation directions can be freely changed, and accordingly the pixels 102 $D_R$, $D_G$, and $D_B$ corresponding to the respective RGB are also changed.

When such lights spatially separated into three wavelength regions are received by the respective three pixels 102, photoelectric conversion is performed by the photoelectric conversion element inside each pixel 102, and an image signal including color information is output.

Note that widths $w_{d1}$, $w_{d2}$, and $w_{d3}$ in the x-axis direction of the three pixels 102 $D_R$, $D_G$, and $D_B$ immediately under each micro-spectroscopic element 101 may be the same or different. In addition, accordingly width $w_{1x}$ in the x-axis direction and width $w_{1y}$ in the y-axis direction of the micro-lens 103 may be the same or different. In the example of FIGS. 3A and 3B, the widths $w_{d1}$, $w_{d2}$, and $w_{d3}$ in the x-axis direction of the three pixels 102 $D_R$, $D_G$, and $D_B$ are the same, but the widths $w_{1x}$ and $w_{1y}$ of the micro-lens 103 are different.

Although a concavo-convex structure that has a high refractive index made of SiN or the like and operates as an inner micro-lens can be included between the pixel unit 110 and micro-spectroscopic element 101, since a micro-spectroscopic element 101 described later can have a lens function depending on phase delay distribution to be formed, it is also possible to omit the inner micro-lens.

Hereinafter, the micro-spectroscopic element according to the embodiment will be described.

The micro-spectroscopic element 101 according to Embodiment 1 includes a plurality of minute columnar structures 121. FIG. 4A is a top view of a columnar structure included in the micro-spectroscopic element in the image capture element according to Embodiment 1 of the present invention, and FIG. 4B is a sectional view thereof. The columnar structure 121 is formed of a material such as SiN having a refractive index $n_1$ higher than a refractive index $n_0$ of the transparent layer 111, and thickness h of the structure is constant.

The bottom and top surfaces of the columnar structure 121 are square. The columnar structure 121 functions as an optical waveguide that confines light in the structure and propagates it because of refractive index difference from the transparent layer 111. Consequently, when light enters from the top surface side, the light propagates while being strongly confined within the columnar structure 121, receives a phase delay effect determined by an effective refractive index $n_{eff}$ of the optical waveguide, and is output from the bottom surface side. Specifically, when a phase of light that has propagated through the transparent layer 111 by the length corresponding to the thickness of the columnar structure 121 is used as a reference, a phase delay amount $\phi$ by the columnar structure 121 is represented by:

$$\phi = (n_{eff} - n_0) \times 2\pi h / \lambda \quad (1)$$

where $\lambda$ denotes a wavelength of light in vacuum. Because this phase delay amount differs by the wavelength $\lambda$ of light, it is possible to give a different phase delay amount to the light incident on the same columnar structure 121 according to a wavelength region (color component). In addition, since the bottom and top surfaces of the columnar structure 121 are square, optical characteristics including the phase delay effect do not change even if a polarization direction is changed. Furthermore, it is known that $n_{eff}$ is a function of structure dimensions, and takes a value of $n_0 < n_{eff} < n_1$. Therefore, in the example shown in FIGS. 4A and 4B, by changing the width w of the columnar structure 121, any phase delay amount can be set.

Figure 5A:
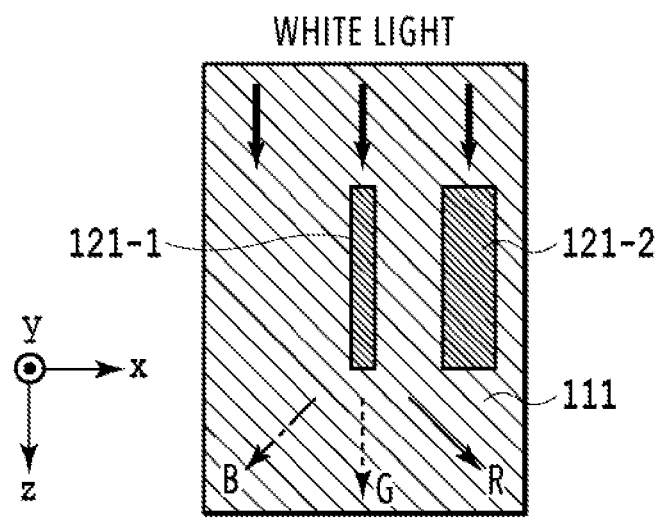
FIG. 5A shows a sectional view of an example of the micro-spectroscopic element in the image capture element according to Embodiment 1 of the present invention.

The sectional view in FIG. 5A is an example of the micro-spectroscopic element 101 according to Embodiment 1 formed by arranging the above-described two columnar structures 121-1 and 121-2 in the x-axis direction. Note that in the y-axis direction, a plurality of sets of the above-described columnar structures 121-1 and 121-2 are disposed at intervals equal to or shorter than the wavelength.

As shown in FIG. 5A, the widths w of the columnar structures 121-1 and 121-2 adjacent in the x-axis direction are different. Due to the difference in the widths w, it becomes possible to give different phase delay distribution to the light that has passed through the micro-spectroscopic element 101 for each wavelength range, and a light wavefront can be changed. Because the propagation direction (deflection direction) of light is determined by the light wavefront, it becomes possible to spatially separate light that has passed through the micro-spectroscopic element 101 according to the wavelength region (color component). That is, the micro-spectroscopic element 101 according to Embodiment 1 gives a different light wavefront according to the wavelength range of the incident light by arranging the plurality of columnar structures 121 and changing the dimension w of the surfaces orthogonal to the propagation direction of light of the adjacent columnar structures 121-1 and 121-2, and thereby spatially separates the color component.

Figure 5B:
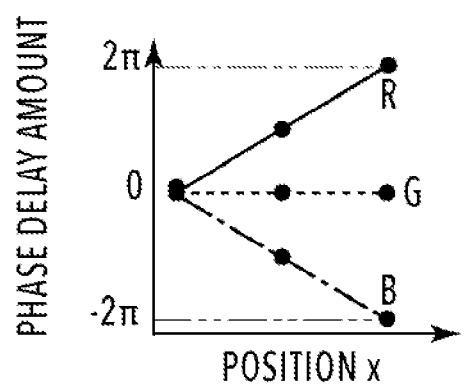
FIG. 5B shows a diagram showing phase delay distribution of three wavelengths separated by the micro-spectroscopic element.

For example, in the case of the structure shown in FIG. 5A, it is possible to give different phase delay distributions according to three wavelengths (for example, wavelengths corresponding to RGB) as shown in FIG. 5B. In this example, the phase delay distribution of the wavelength corresponding to the light (R) of the first color component is along a straight line on which the phase amount linearly increases from 0 to $+2\pi$, the phase delay distribution of the wavelength corresponding to the light (G) of the second color component does not spatially change, and the phase delay distribution of the wavelength corresponding to the light (B) of the third color component is along a straight line on which the phase amount linearly decreases from 0 to $-2\pi$. In this case, the light that has passed through the micro-spectroscopic element 101 can efficiently propagate such that the light (R) of the first color component, the light (G) of the second color component, and the light (B) of the third color component propagate to the first direction (right), the second direction (straight forward), and the third direction (left), respectively, as shown in FIG. 5A.

Note that the above description is an example, depending on the dimensions of each columnar structure 121, a combination of color components and deflection directions can be freely changed. For example, the light (R) of the first color component, the light (G) of the second color component, and the light (B) of the third color component can efficiently propagate to the second direction (straight forward), the first direction (right), and the third direction (left), respectively.

A more detailed example of the micro-spectroscopic element 101 according to the embodiment will be described.

Figure 6A:
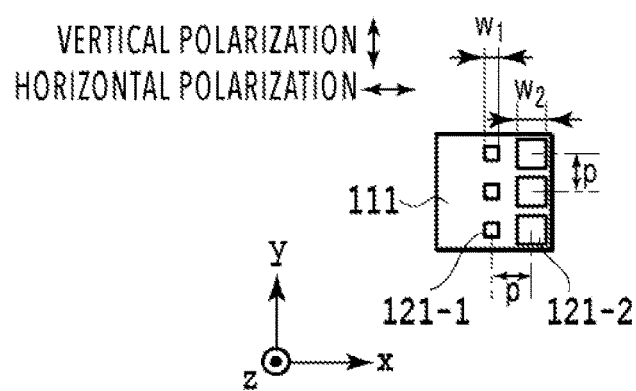
FIG. 6A shows a top view of an example of the micro-spectroscopic element in the image capture element according to Embodiment 1 of the present invention.
Figure 6B:
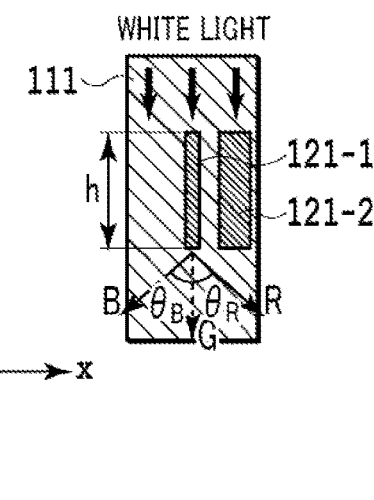
FIG. 6B shows a sectional view thereof.

FIG. 6A is a top view of an example of a micro-spectroscopic element in the image capture element according to Embodiment 1 of the present invention, and FIG. 6B is a sectional view thereof. The two columnar structures 121-1 and 121-2 having widths $w_1$ and $w_2$ different from each other but constant thickness (length in the direction perpendicular to the two-dimensional pixel array) are disposed in the x-axis direction, three sets of the same columnar structures 121-1 and 121-2 are disposed in the y-axis direction, and those are regarded as one micro-spectroscopic element 101. Note that a material used to make the columnar structures 121-1 and 121-2 is assumed to be SiN ($n_1$=2.03), a material used to make the transparent layer is assumed to be SiO$_2$ ($n_0$=1.45), and the case where the bottom and top surfaces are square is shown. The thickness h of all the columnar structures 121-1 and 121-2 is 1200 nm, the width $w_1$ of the columnar structure 121-1 on the left side of the pattern is 145 nm, the width $w_2$ of the columnar structure 121-2 on the right side of the pattern is 340 nm, and intervals p between the columnar structures 121-1 and 121-2 in the x-axis direction and y-axis direction are 450 nm.

Figure 7A:
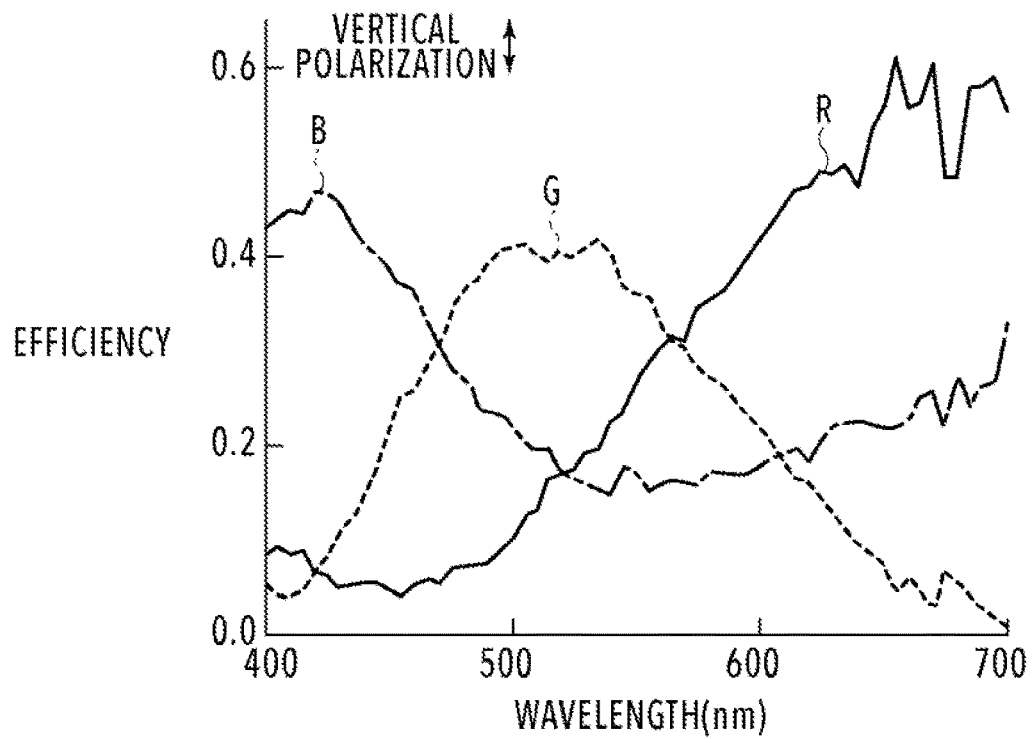
FIG. 7A shows a diagram showing wavelength dependency of efficiency of propagation in three directions separated at an emission end of the micro-spectroscopic element when parallel light having vertical polarization is entered from a top surface of the columnar structure in the image capture element according to Embodiment 1 of the present invention.
Figure 7B:
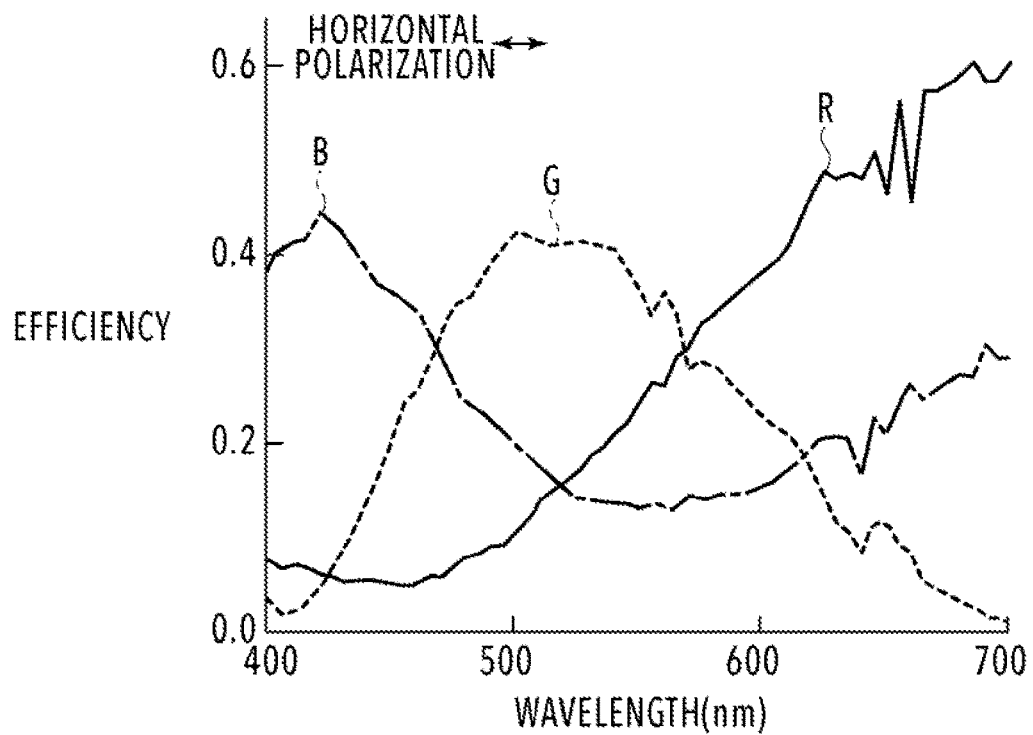
FIG. 7B shows a diagram showing wavelength dependency of efficiency of propagation in three directions separated at the emission end of the micro-spectroscopic element when parallel light having horizontal polarization is entered from the top surface of the columnar structure.
Figure 8A:
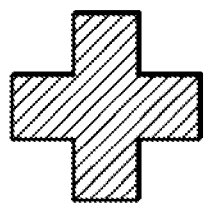
FIG. 8A shows a structure pattern example of the micro-spectroscopic element in the image capture element according to Embodiment 1 of the present invention.
Figure 8E:
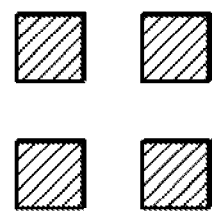
FIG. 8E shows a structure pattern example of the micro-spectroscopic element in the image capture element according to Embodiment 1 of the present invention.
Figure 8B:
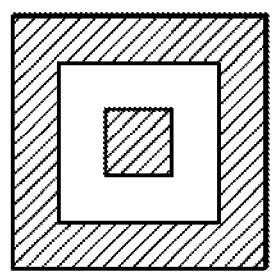
FIG. 8B shows a structure pattern example of the micro-spectroscopic element in the image capture element according to Embodiment 1 of the present invention.
Figure 8F:
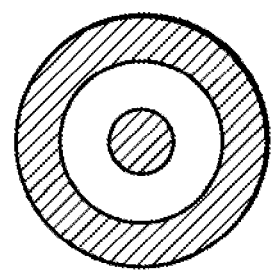
FIG. 8F shows a structure pattern example of the micro-spectroscopic element in the image capture element according to Embodiment 1 of the present invention.
Figure 8C:
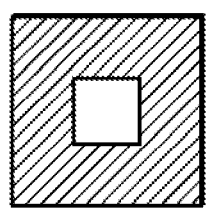
FIG. 8C shows a structure pattern example of the micro-spectroscopic element in the image capture element according to Embodiment 1 of the present invention.
Figure 8G:
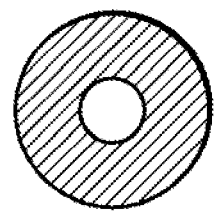
FIG. 8G shows a structure pattern example of the micro-spectroscopic element in the image capture element according to Embodiment 1 of the present invention.
Figure 8D:
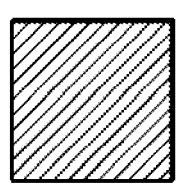
FIG. 8D shows a structure pattern example of the micro-spectroscopic element in the image capture element according to Embodiment 1 of the present invention.
Figure 8H:
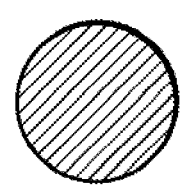
FIG. 8H shows a structure pattern example of the micro-spectroscopic element in the image capture element according to Embodiment 1 of the present invention.

FIGS. 7A and 7B show wavelength dependency (calculation results based on exact coupled wave theory) of efficiency of propagation (ratio of light intensity in each propagation direction to incident light intensity) in three directions (directions of R, G, and B in FIG. 6B) separated at an emission end of the micro-spectroscopic element 101 when parallel light has entered from the top surfaces of the columnar structures 121-1 and 121-2 in the above-described structure. FIGS. 7A and 7B are results when the light having vertical polarization in FIG. 6A and the light having horizontal polarization in FIG. 6A have entered, respectively. Note that at the time of calculation, although it is assumed that the above-described micro-spectroscopic elements 101 are disposed at intervals of P (P=3p) in the x axis and y-axis directions, it has been confirmed that there is almost no difference from an optical function of a single micro-spectroscopic element 101. Deflection angles $\theta_R$, $\theta_G$, and $\theta_B$ in the three directions are based on light diffraction, and it is assumed that R: $\sin \theta_R = \lambda/P$, G: $\theta_G = 0$ (straight forward), and B: $\sin \theta_B = \lambda/P$.

Characteristics shown in FIGS. 7A and 7B correspond to spectral sensitivity characteristics of color filters in a conventional image capture device. Results shown in FIGS. 7A and 7B indicate that efficiency in the first direction (R) has a peak in a red wavelength region of 600 nm or more, efficiency in the second direction (G) has a peak in a green wavelength region of 500-600 nm, and efficiency in the third direction (B) has a peak in a blue wavelength region of 500 nm or less. In addition, a good spectral performance of 40-60% is indicated, and there is no significant polarization dependency in the characteristics. Note that the total of curves R, G, and B, that is, the total transmittance is 95% or more, and light loss due to scattering or reflection hardly occurs.

The above results indicate that the use of the micro-spectroscopic element 101 according to Embodiment 1 enables highly efficient spatial separation of color components. Furthermore, in the above-described example, the size of the single micro-spectroscopic element 101 is 1.35 µm square and is equivalent to the minimum pixel size of general CCD and CMOS sensors. Therefore, it is possible to form the micro-spectroscopic element 101 corresponding to the pixel unit 110 having the minimum pixel size. Note that the micro-spectroscopic elements 101 having different sizes can be formed depending on the size, number, and arrangement pattern of the columnar structures 121.

Desired spectral characteristics can be given by appropriately designing the material, number, shape, size, arrangement pattern, and the like of the columnar structures 121 included in the micro-spectroscopic element 101. As a result, as described above, only light in a desired wavelength region can be separated and incident on an individual photoelectric conversion element, and a signal corresponding to a color component can be obtained from a photoelectric conversion signal output from each photoelectric conversion element.

As described above, since light loss by the micro-spectroscopic element 101 hardly occurs, as compared with an image capture element using color filters of the prior art, the total quantity of light reaching the pixel array can be significantly increased and image capturing sensitivity can be increased. Note that even if the spectral performance of each micro-spectroscopic element 101 is slightly different from the ideal performance described above, good color information can be obtained by correcting and calculating an obtained signal according to the degree of the difference in performance.

In the above-described arrangement of each columnar structure 121, it is desirable to arrange it at intervals equal to or less than the wavelength of light in order to prevent unnecessary diffracted light from being generated due to the periodic structure.

In the above-described example, the case where the bottom and top surfaces of the columnar structure are square has been described, but the present invention is not limited to this shape. That is, as long as the shape surface has a four-fold rotational symmetry with the axis passing through the centers of the bottom and top surfaces as the symmetry axis, the dependence of the spectroscopic function on polarization does not occur, and the operation as an optical waveguide that provides a phase delay effect is not lost. Therefore, it is desirable to adopt a columnar structure having a surface with four-fold rotational symmetry such as a square, a hollow square, a circle, a hollow circle, and a cross shape as shown in FIGS. 8A, 8B, 8C, 8D, 8E, 8F, 8G and 8H In order for each light space distribution above the pixel unit 110 to be sufficiently separated after separation of color components by the micro-spectroscopic element 101, an interval between an output end of the micro-spectroscopic element 101 and the photoelectric conversion element of the pixel 102 is preferably 1 μm or more. On the other hand, in order to reduce the thickness of the image capture element 100 and to save material costs and process time, the above-described interval between the output end of the micro-spectroscopic element 101 and the photoelectric conversion element of the pixel 102 is preferably as short as possible.

In this case, since the light spatial distributions above the pixel unit 110 need to be clearly separated from each other according to color components in a short propagation distance, it is preferable to increase a deflecting (bending) angle by largely tilting the light wavefront by the micro-spectroscopic element 101. In order to increase the deflecting angle, since a shape in which the phase delay distribution in each wavelength region formed by the micro-spectroscopic element 101 varies from 0 to $2\pi$ is suitable, it is preferable that a variable range of the phase delay amount by the columnar structure 121 is $2\pi$ or more in each wavelength region. Therefore, from Formula (1), assuming that a desired central wavelength in a wavelength region on the longest wavelength side of the wavelength region to be separated is $\lambda_r$, it is desirable that the thickness h of the columnar structure 121 is set in the vicinity of $h=\lambda_r/(n_1-n_0)$.

The micro-spectroscopic element 101 having the spectroscopic function as above can be manufactured by performing thin film deposition and patterning by known semiconductor manufacturing techniques. Since the micro-spectroscopic element 101 of Embodiment 1 includes a plurality of columnar structures 121 having constant thickness, the micro-spectroscopic element 101 can be easily manufactured at low cost compared with the stepped structure disclosed in Non Patent Literature 1 or the like.

Hereinafter, arrangement of the micro-optical element and pixel in the image capture element of the embodiment will be described.

In the example shown in FIGS. 3A and 3B, a row of the micro-spectroscopic elements 101 disposed along the x-axis direction is repeatedly disposed along the y-axis direction without shifting in the x-axis direction, and as a result, a pattern of the micro-spectroscopic elements 101 is consecutively disposed along the y-axis direction. In this case, in the x-axis direction, the three pixels 102 $D_B$, $D_G$, and $D_R$ corresponding to the color components immediately under each micro-spectroscopic element 101 are arranged in this order from the left, and this arrangement is repeatedly disposed.

Furthermore, similarly for the pixel 102, a row of the pixels 102 disposed along the x-axis direction is repeatedly disposed along the y-axis direction without shifting in the x-axis direction, and as a result, the three pixels 102 $D_B$, $D_G$, and $D_R$ are consecutively disposed along the y-axis direction.

Figure 9C:
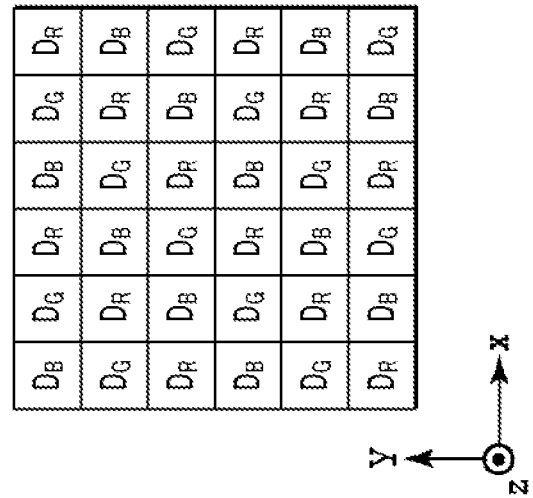
FIG. 9C shows a diagram schematically representing an arrangement of pixels corresponding to color components of the image capture element according to Embodiment 1 of the present invention.
Figure 9B:
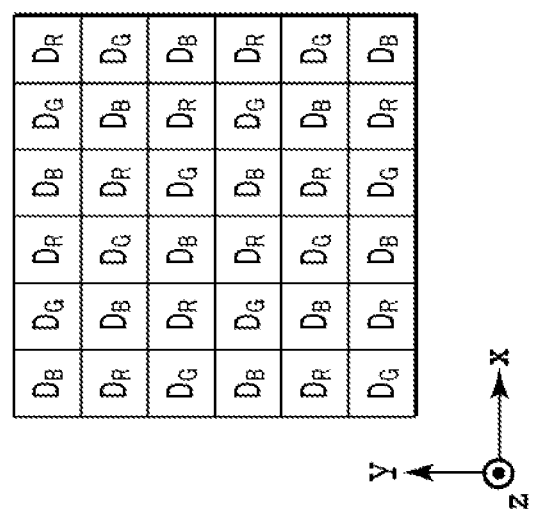
FIG. 9B shows a diagram schematically representing an arrangement of pixels corresponding to color components of the image capture element according to Embodiment 1 of the present invention.
Figure 9A:
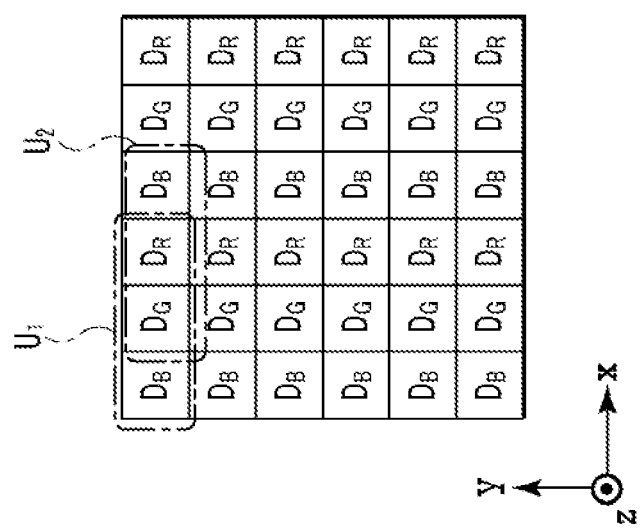
FIG. 9A shows a diagram schematically representing an arrangement of pixels corresponding to color components of the image capture element according to Embodiment 1 of the present invention.

FIGS. 9A, 9B and 9C schematically show pixel arrangement corresponding to color components of the image capture element according to Embodiment 1 of the present invention. Defining the three pixels 102 $D_B$, $D_G$, and $D_R$ adjacent in the x-axis direction as one color pixel unit U, a color pixel unit $U_1$ and a color pixel unit $U_2$ shifted in the x-axis direction by a single pixel with respect to the color pixel unit $U_1$ shown in FIG. 9A each always include one pixel each corresponding to R, G, and B. That is, if the color information is obtained while shifting the color pixel unit U by a single pixel on the xy plane, it is possible to obtain information on the RGB three colors as many as approximately the number of pixels. This means that the resolution of the image capture element can be increased to the number of pixels (equivalent to so-called Bayer arrangement). Therefore, the image capture element of Embodiment 1 can generate color information with high resolution of the single pixel size in addition to high sensitivity.

Arrangement of the micro-optical element and pixel that achieve the resolution of the single pixel size as described above is not limited to FIG. 9A, and can be variously changed. FIGS. 9B and 9C show other examples, in which the rows of the micro-spectroscopic elements 101 and color pixel units U formed along the x-axis direction are sequentially disposed along the y-axis direction while shifting in the x-axis direction by a one-pixel size in FIG. 9B and by a two-pixel size in FIG. 9C. Also for the arrangement like this, color information can be generated with the resolution of the single pixel size in the same manner as FIG. 9A.

Figure 10C:
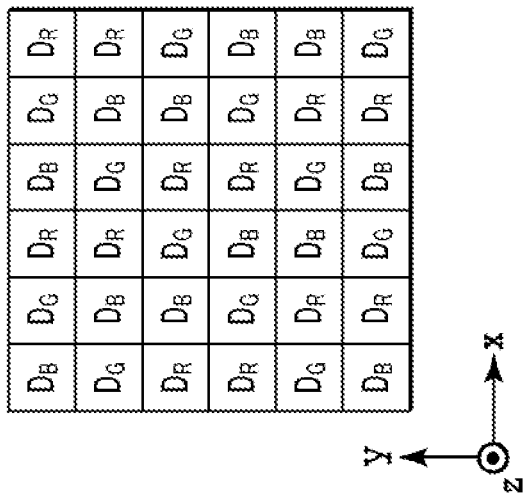
FIG. 10C shows a diagram schematically representing an arrangement of pixels corresponding to color components of the image capture element according to Embodiment 1 of the present invention.
Figure 10B:
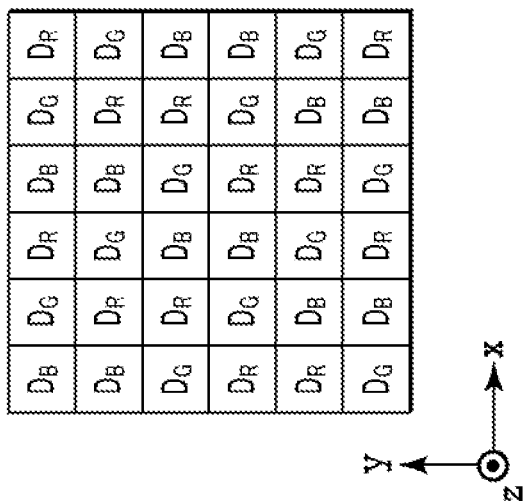
FIG. 10B shows a diagram schematically representing an arrangement of pixels corresponding to color components of the image capture element according to Embodiment 1 of the present invention.
Figure 10A:
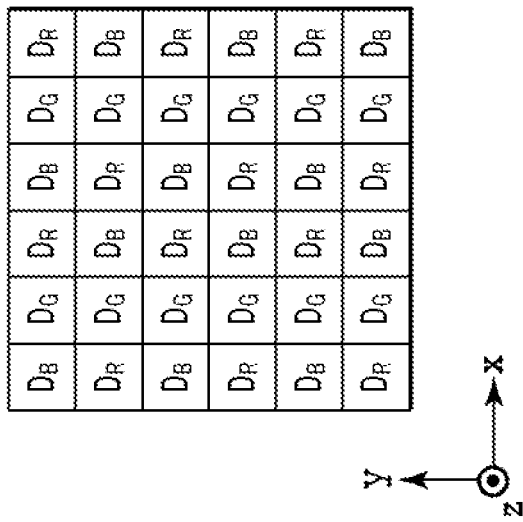
FIG. 10A shows a diagram schematically representing an arrangement of pixels corresponding to color components of the image capture element according to Embodiment 1 of the present invention.

FIGS. 10A, 10B and 10C show arrangement examples different from those shown in FIGS. 9A, 9B, and 9C, and in the configuration, the order of the three pixels 102 $D_B$, $D_G$, and $D_R$ is reversed for each row, and the shift in the x-axis direction is the same as that in FIGS. 9A, 9B and 9C. Also in this case, color information can be generated with the resolution of the single pixel size as in FIG. 9A. In order to reverse the order of the three pixels 102 $D_B$, $D_G$, and $D_R$, a pattern in which the columnar structures 121-1 and 121-2 of the micro-spectroscopic element 101 described above are horizontally reversed on the x axis may be used.

The above-described pixel arrangement shown in FIGS. 9A, 9B and 9C and FIGS. 10A, 10B and 10C is an arrangement when it is assumed that, by the function of the micro-spectroscopic element 101 for incident light, the light (R) of the first color component, the light (G) of the second color component, and the light (B) of the third color component propagate to the first direction (right), the second direction (straight forward), and the third direction (left), respectively, and the three pixels 102 $D_R$ (right), $D_G$ (center), and $D_B$ (left) immediately under each micro-spectroscopic element 101 correspond to detection of color information on R, G, and B, respectively. As described above, depending on the configuration of the micro-spectroscopic element 101, the pixel 102 immediately under the micro-spectroscopic element 101 is changed to a pixel corresponding to any of RGB three colors, but basically the order within the color pixel unit U is only changed. Also in such a case, as long as the arrangement is set according to the arrangement rules of the color pixel unit U shown in FIGS. 9A, 9B, 9C, 10A, 10B and 10C, color information can be generated with the resolution of the single pixel size in the same manner.

In the above description, the image capture element 100 using only the micro-spectroscopic element 101 has been described. Next, a modified example in which a color subtractive-type color filter is used together will be described.

Figure 11:
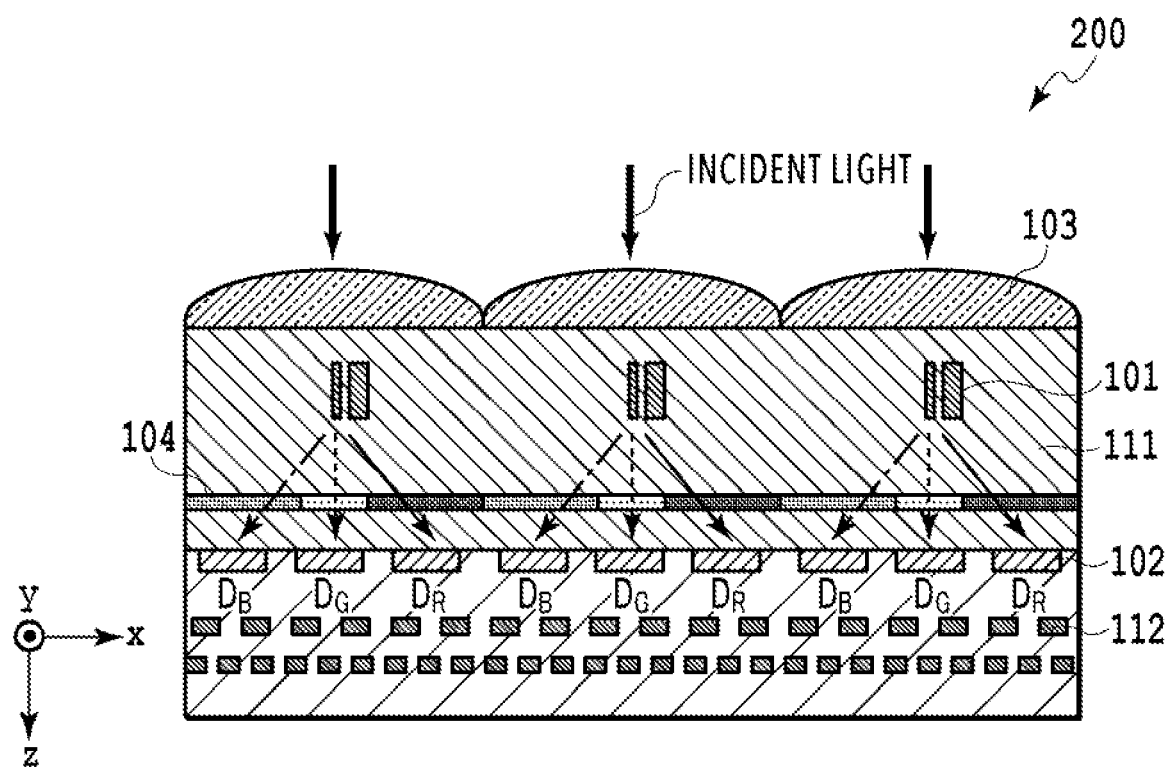
FIG. 11 shows a sectional view showing a schematic configuration of an image capture element which is a modified example of Embodiment 1 of the present invention.

FIG. 11 shows a sectional view of a schematic configuration of an image capture element which is a modified example of Embodiment 1 of the present invention. Difference from FIGS. 3A and 3B is that color filters 104 corresponding to respective colors of the pixels 102 are disposed upward of the pixels 102 corresponding to the respective color components, and others are the same. This configuration improves light utilization efficiency and also improves color reproducibility compared with a configuration of only color filters in the prior art.

For example, from FIGS. 7A and 7B, the spectral efficiency to RGB of the micro-spectroscopic element 101 is assumed to be 40-60%. The transmittance (spectral efficiency) of color filters 104 of RGB in the respective wavelength regions is assumed to be 90%. The incident light is assumed to have intensity of a ratio of RGB 1:1:1. In this case, in a configuration using both micro-spectroscopic element 101 and color filters 104, since light passes through both and enters the pixel, the total amount of light intensity reaching the three pixels 102 of RGB becomes 36-54%. Furthermore, the spectral performances of the micro-spectroscopic element 101 and color filters 104 are multiplied and light is incident on each pixel 102 in a state where unnecessary color components are eliminated, so the color reproducibility is greatly improved. On the other hand, in the case of the configuration of only color filters 104, the total quantity of light intensity reaching the three pixels 102 becomes 30% and the color reproducibility is also worse than that of the configuration using both. Consequently, by using the configuration using both micro-spectroscopic element 101 and color filters 104, it is expected to improve the sensitivity by 1.2-1.8 times compared to the conventional configuration using only color filters in a state where the color reproducibility is improved. Note that as compared with the configuration using only the micro-spectroscopic elements 101, the light utilization efficiency reduces, but because the color reproducibility significantly increases, the modified example of Embodiment 1 can be said as a configuration that has a good balance between the light utilization ratio, that is, sensitivity and the color reproducibility.

Embodiment 2

Next, an image capture element according to Embodiment 2 of the present invention will be described.

Figure 12A:
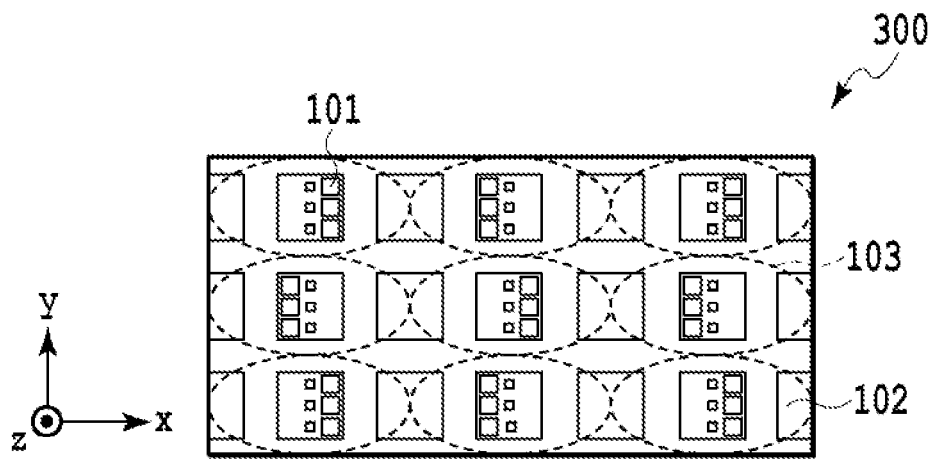
FIG. 12A shows a top view of a schematic configuration of a part of an image capture element according to Embodiment 2 of the present invention.
Figure 12B:
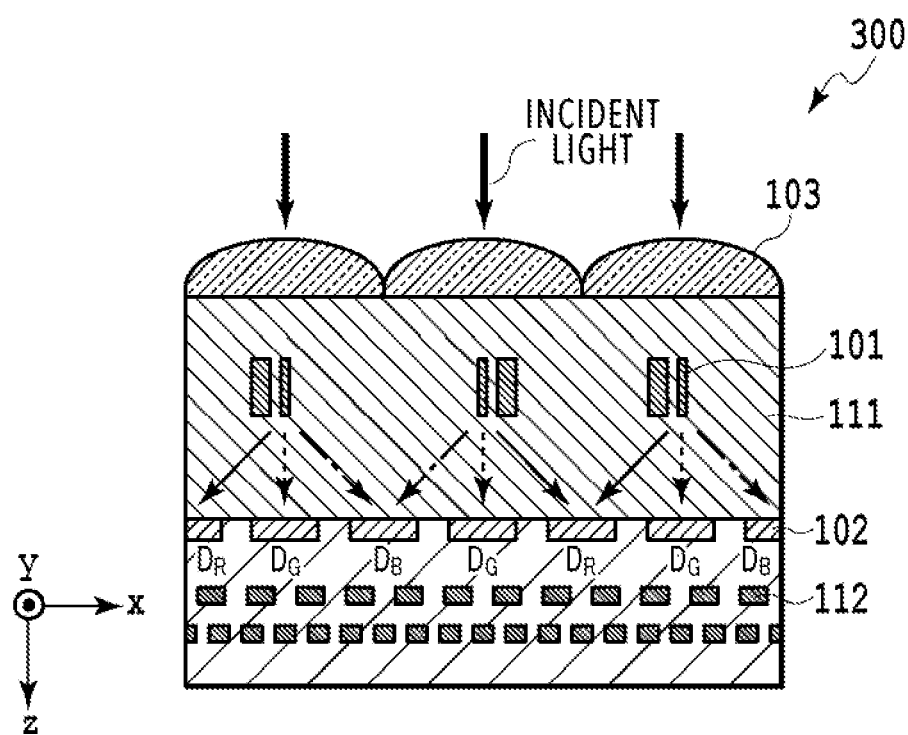
FIG. 12B shows a sectional view thereof.

FIG. 12A is a top view of a schematic configuration of a part of the image capture element according to Embodiment 2 of the present invention, and FIG. 12B is a sectional view thereof. As shown in FIGS. 12A and 12B, an image capture element 300 of Embodiment 2 and an image capture device using it is different from Embodiment 1 in that the direction of a structure pattern of a plurality of micro-spectroscopic element 101 disposed along the x-axis direction is alternately reversed.

The rows of the micro-spectroscopic elements 101 and color pixel units U formed along the x-axis direction are sequentially disposed in the y-axis direction while shifting in the x-axis direction by a two-pixel size, and as a result, the direction of the structure pattern of the micro-spectroscopic element 101 is alternately reversed in the y-axis direction also. Furthermore, there is also difference in that two outer pixels 102 among three pixels 102 that are adjacent to each other along the x-axis direction and that receive light separated by one micro-spectroscopic element 101 also receive light separated by adjacent other two micro-spectroscopic elements 101. Note that other components of Embodiment 2 are the same as those of Embodiment 1. The description below will focus on differences from Embodiment 1 and description of overlapping points will be omitted.

As shown in FIG. 12B, since the direction of the structure pattern of the micro-spectroscopic elements 101 is alternately reversed along the x-axis direction, the combination of the color components and deflection directions is alternately reversed, and accordingly, the pixels 102 corresponding to the color components immediately under each micro-spectroscopic element 101 are in the order of $D_R$, $D_G$, $D_B$, $D_G$, $D_R$, $D_G$, $D_B$, . . . , from the left. The pixel 102 $D_G$ is disposed immediately under each micro-spectroscopic element 101, and the pixel 102 $D_R$ or $D_B$ on each side of it also receives light separated by two adjacent micro-spectroscopic elements 101.

White light incident on the image capture element 300 is first condensed by the micro-lens array and almost all the light passes through the micro-spectroscopic element 101 corresponding to each micro-lens 103. The light is spatially separated into three wavelength regions in the xz plane by each micro-spectroscopic element 101, and is received by the respective three pixels 102 corresponding to each micro-spectroscopic element 101. At this time, the pixels 102 ($D_R$ and $D_B$) on both sides of the pixel 102 ($D_G$) immediately under the micro-spectroscopic element 101 also receive light that has propagated from adjacent two micro-spectroscopic elements 101, and receive the same wavelength region by the reversal of the structure pattern.

The above is an example, and depending on the configuration of each micro-spectroscopic element 101, a combination of the color components and propagation directions can be freely changed, and accordingly, the pixel 102 corresponding to each RGB is also changed. When lights spatially separated into the three wavelength regions like this are received by the respective three pixels 102, photoelectric conversion is performed by the photoelectric conversion element in each pixel 102, and an image signal including color information is output.

Figure 13:
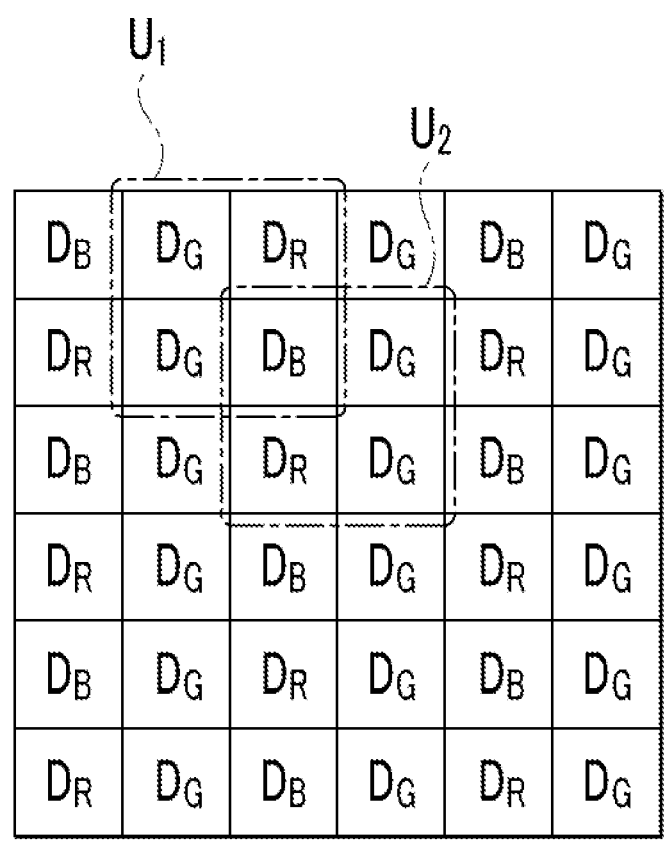
FIG. 13 is a diagram schematically representing pixel arrangement of the image capture element according to Embodiment 2 of the present invention.

FIG. 13 is a diagram schematically representing pixel arrangement of the image capture element according to Embodiment 2 of the present invention. Four pixels 102 including one $D_R$, two $D_G$, and one $D_B$ are set as one color pixel unit U. In this case, even if a color pixel unit $U_1$ shown in the FIG. 13 is shifted in the x-axis direction or y-axis direction by a single pixel, a color pixel unit $U_2$ including one $D_R$, two $D_G$, and one $D_B$ can be formed. That is, if color information is obtained while shifting the color pixel unit U by a single pixel on the xy plane, information on RGB three colors can be obtained as many as approximately the number of pixels. This means that the resolution of the image capture element can be increased to about the number of pixels. Therefore, the image capture element 300 of Embodiment 2 can generate color information with high resolution of a single pixel size in addition to high sensitivity.

From the above, also in the configuration of Embodiment 2, functions similar to those of Embodiment 1 can be implemented. Embodiment 2 is the same as Embodiment 1 other than the above-described differences from Embodiment 1, and the common components have the same effects as those described in Embodiment 1, and can be modified in the same manner.

Embodiment 3

Next, an image capture element according to Embodiment 3 of the present invention will be described.

Figure 14A:
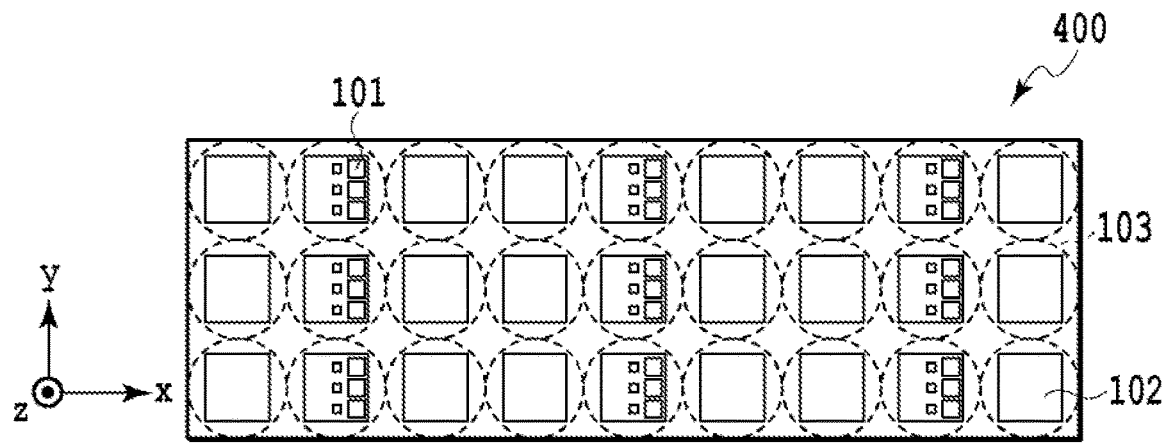
FIG. 14A shows a top view of a schematic configuration of a part of an image capture element according to Embodiment 3 of the present invention.
Figure 14B:
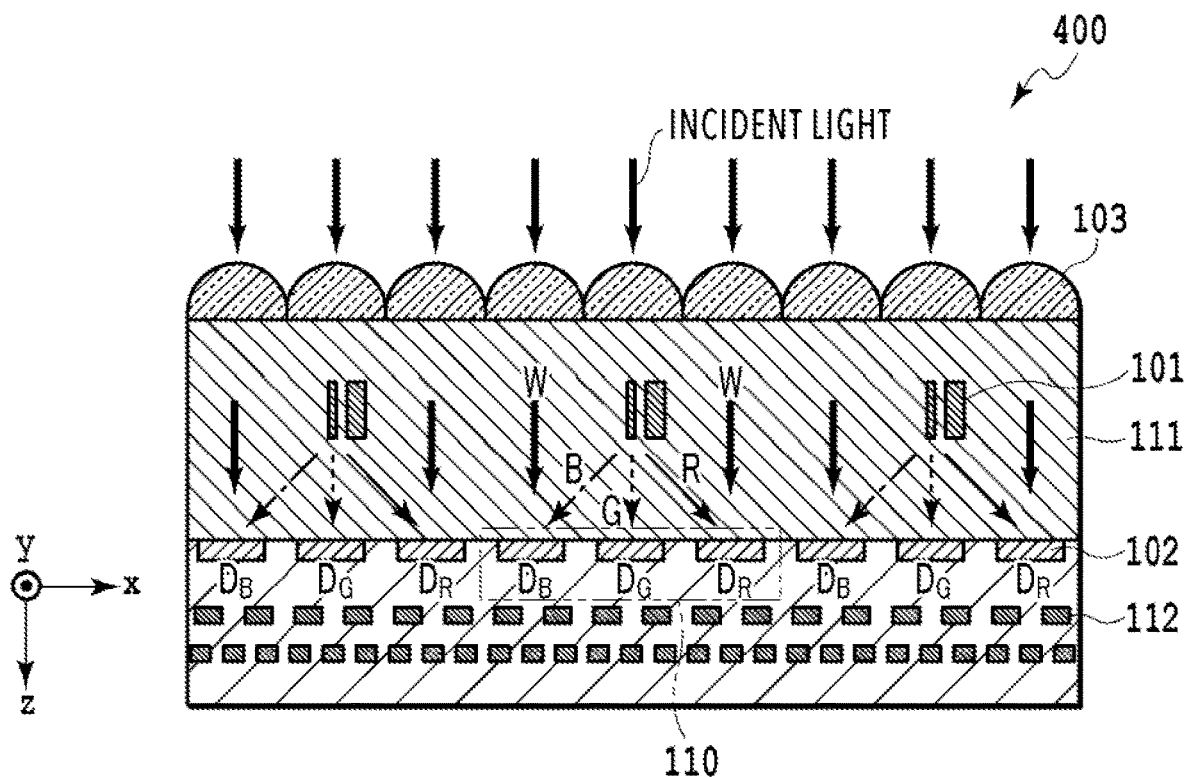
FIG. 14B shows a sectional view thereof.

FIG. 14A is a top view of a schematic configuration of a part of the image capture element according to Embodiment 3 of the present invention, and FIG. 14B is a sectional view thereof. As shown in FIGS. 14A and 14B, an image capture element 400 of Embodiment 3 and an image capture device are different from Embodiment 1 in that micro-lenses are disposed so as to correspond to the respective pixels on a one-on-one basis. In addition, they are also different in that matrix calculation using the photoelectric conversion signal from each pixel 102 is used for obtaining color information. Other components are the same as those in Embodiment 1. The description below will focus on differences from Embodiment 1 and description of overlapping points will be omitted.

As shown in FIG. 14B, micro-lenses 103 are disposed so as to correspond to the respective pixels 102 on a one-on-one basis. Accordingly, of white light incident on the image capture element 400, light which is incident on each micro-spectroscopic element 101 and color separated is only light condensed by the micro-lens 103 situated immediately above a micro-spectroscopic element 101, and the other light is directly incident on the pixels immediately under the respective micro-lenses via the respective micro-lenses 103.

Here, assuming that the intensity of white light incident on the single micro-lens 103 is denoted by W and the intensity of RGB three colors included in the white light is R, G, and B, respectively, light incident on pixels 102 $D_R$, $D_G$, and $D_B$ via three micro-lenses 103 is light having intensity represented by W+R, G, and W+B, respectively. Note that the above is one example, and depending on a configuration of each micro-spectroscopic element 101, the combination of the color components and propagation directions can be freely changed, and accordingly, the configuration of color components incident on the respective pixels 102 $D_R$, $D_G$, and $D_B$ is also changed. In the following description, color information acquisition by matrix calculation when light having the intensity of W+R, G, and W+B is incident on the pixels 102 $D_R$, $D_G$, and $D_B$, respectively, is described, but it goes without saying that numerical values of matrix operators can be variously changed depending on the configuration and spectral performance of the micro-spectroscopic element 101.

The light having the intensity of W+R, G, and W+B incident on the respective pixels 102 goes through photoelectric conversion by the photoelectric conversion elements and is output as photoelectric conversion signals. Here, photoelectric conversion signals corresponding to light intensity of the RGB three colors and white light W are denoted by $S_R$, $S_G$, $S_B$, and $S_W$, respectively, and photoelectric conversion signals output by the respective pixels 102 on which the light having the intensity of W+R, G, and W+B is incident are denoted by $S_{W+R}$, $S_G$, and $S_{W+B}$, respectively. Note that $S_W$ is represented by $S_W=S_R+S_G+S_B$, and $S_{W+R}$ and $S_{W+B}$ can be represented by relational formulas of $S_{W+R}=S_W+S_R$ and $S_{W+B}=S_W+S_B$, respectively. In addition, since the light incident on the pixel 102 $D_G$ is the component of G separated by the micro-spectroscopic element 101, $S_G$ is output as it is.

From the above, $S_R$, $S_G$, and $S_B$ can be obtained by the following matrix calculation using $S_{W+R}$, $S_G$, and $S_{W+B}$.

[Expression 1]

$$\begin{pmatrix} 3S_R \\ 3S_G \\ 3S_B \end{pmatrix} = \begin{pmatrix} 2 & -1 & -1 \\ 0 & 3 & 0 \\ -1 & -1 & 2 \end{pmatrix} \begin{pmatrix} S_{W+R} \\ S_G \\ S_{W+B} \end{pmatrix} \quad (2)$$

Therefore, by signal calculation using the three photoelectric conversion signals $S_{W+R}$, $S_G$, and $S_{W+B}$ output from the respective pixels $D_R$, $D_G$, and $D_B$, $S_R$, $S_G$, and $S_B$ which are intensity information on the three color components can be obtained.

From the above, also in the configuration of Embodiment 3, functions similar to those of Embodiment 1 can be implemented. Embodiment 3 is the same as Embodiment 1 other than the above-described differences from Embodiment 1, and the common components have the same effects as those described in Embodiment 1, and can be modified in the same manner. Note that in the modified example of using a combination with color filters, it is desirable that a color filter of a corresponding color component is disposed only above the pixel 102 immediately under the micro-spectroscopic element 101.

Embodiment 4

Next, an image capture element according to Embodiment 4 of the present invention will be described.

Figure 15A:
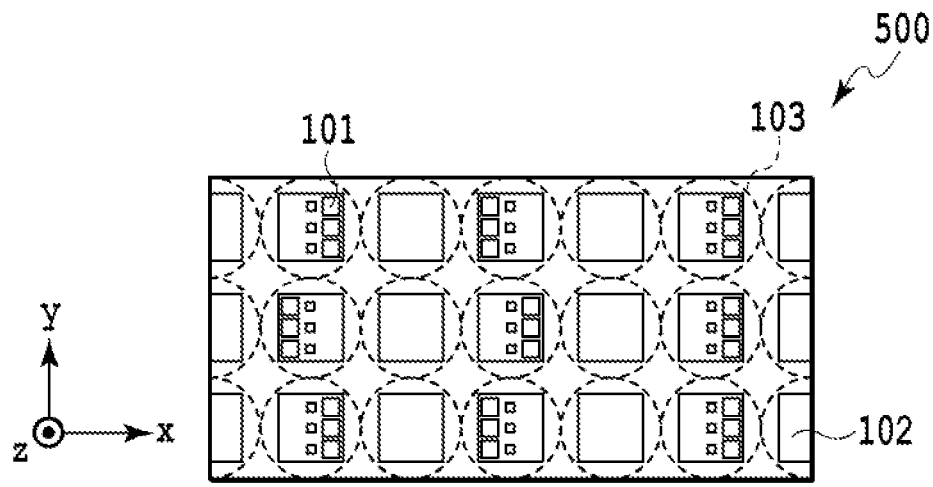
FIG. 15A shows a top view of a schematic configuration of a part of an image capture element according to Embodiment 4 of the present invention.
Figure 15B:
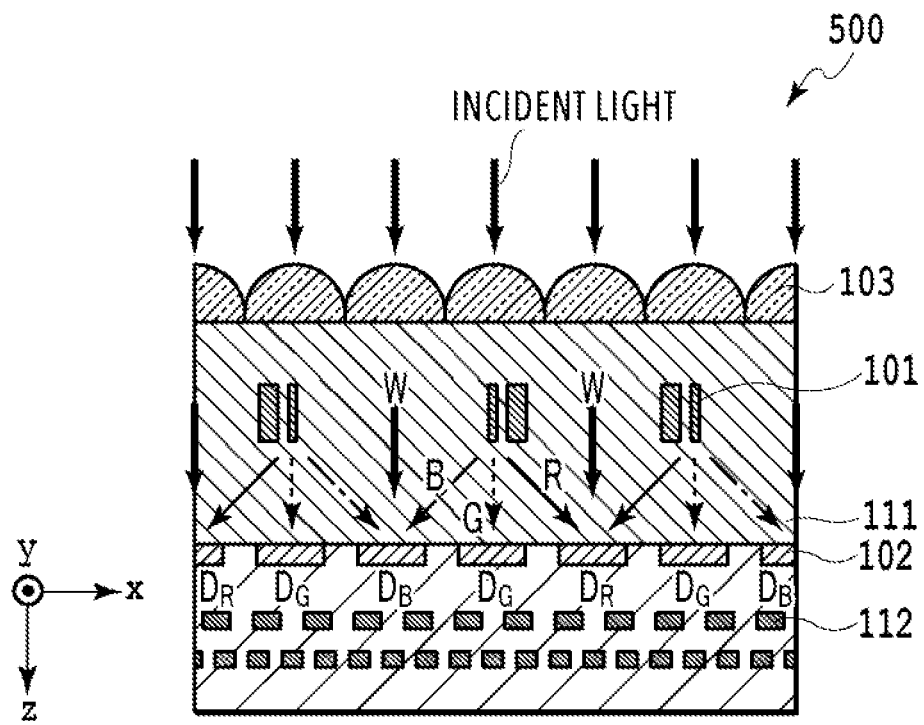
FIG. 15B shows a sectional view thereof.
Figure 16:
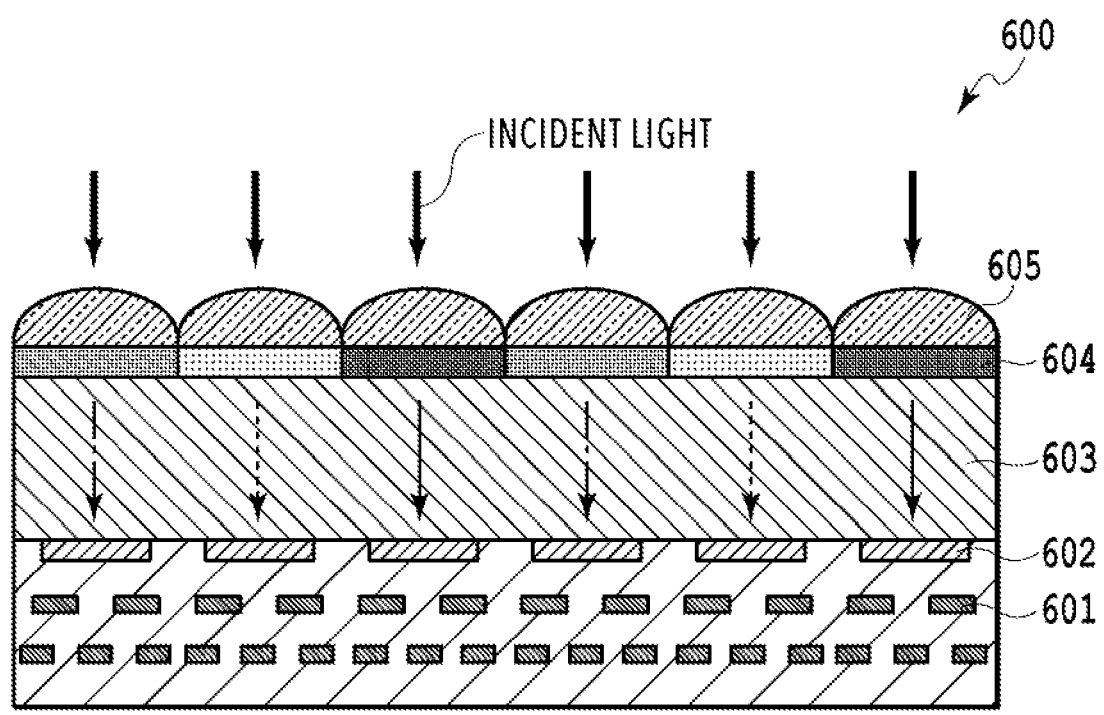
FIG. 16 is a sectional view of a conventional color image-capture element.
Figure 17A:
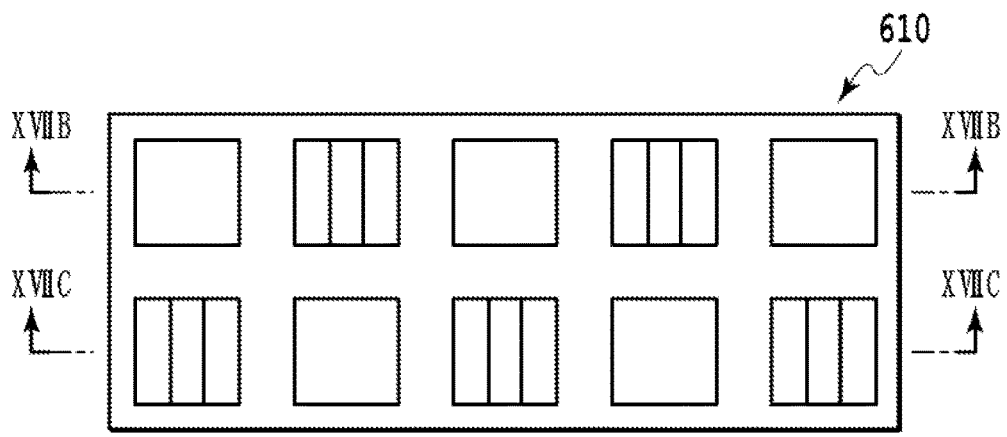
FIG. 17A shows a top view of a color image-capture element using a conventional spectroscopic element.
Figure 17B:
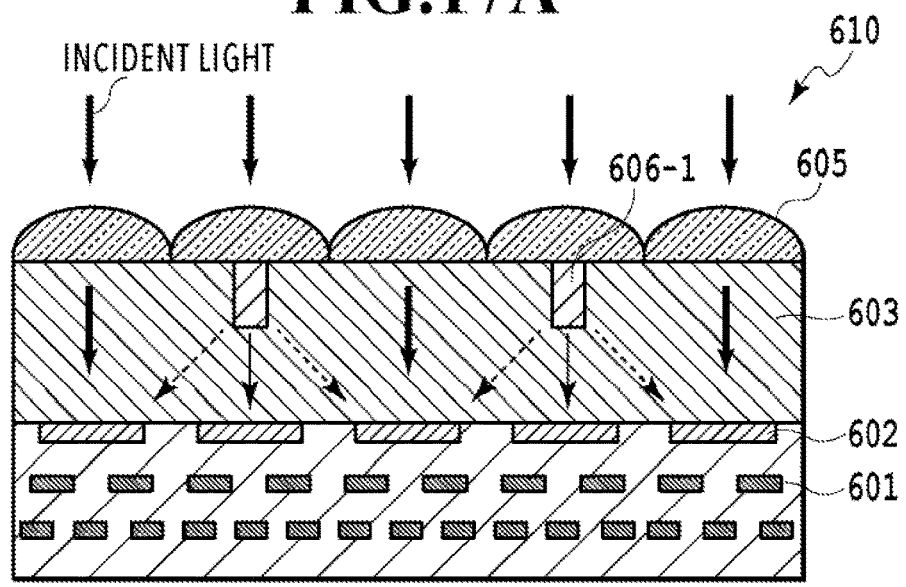
FIG. 17B shows a sectional view along XVIIb-XVIIb thereof.
Figure 17C:
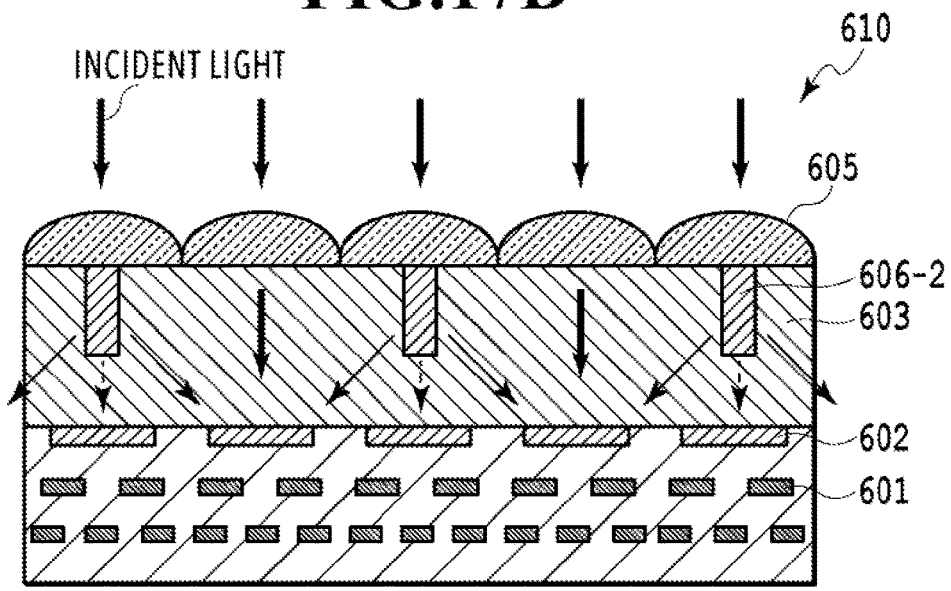
FIG. 17C shows a sectional view along XVIIc-XVIIc thereof.
Figure 18:
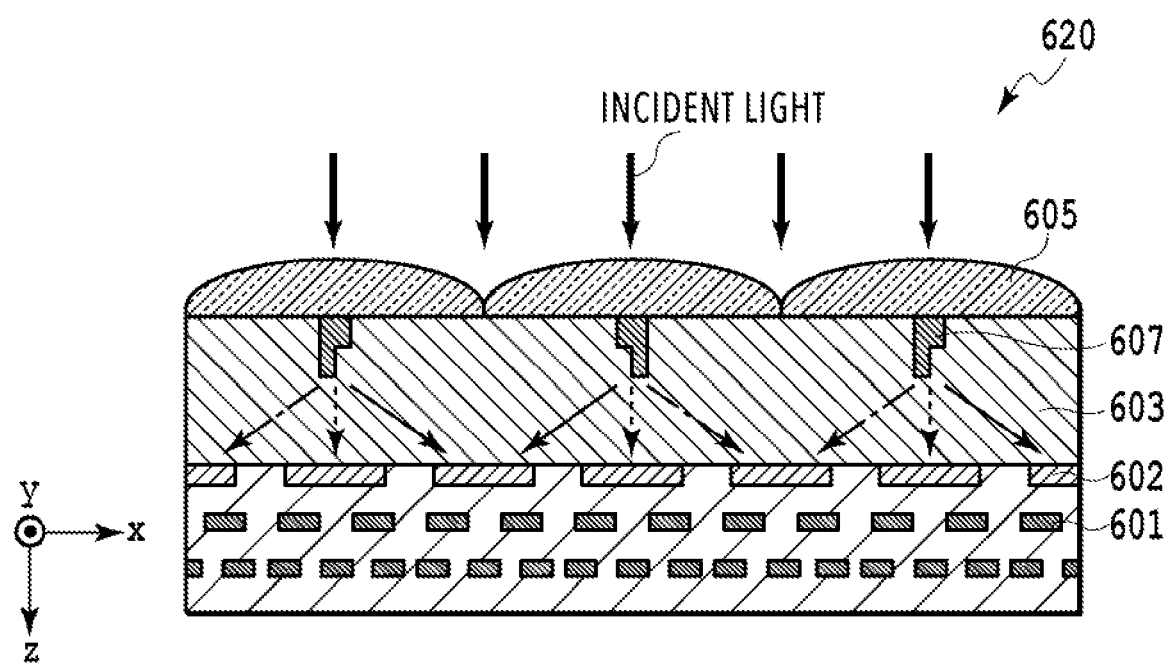
FIG. 18 is a sectional view of another color image-capture element using the conventional spectroscopic element.

FIG. 15A is a top view of a schematic configuration of a part of the image capture element according to Embodiment 4 of the present invention, and FIG. 15B is a sectional view thereof. As shown in FIGS. 15A and 15B, an image capture element 500 of Embodiment 4 and an image capture device using it are different from Embodiment 2 in that micro-lenses 103 are disposed so as to correspond to respective pixels 102 on a one-to-one basis. In addition, they are also different in that matrix calculation using the photoelectric conversion signal from each pixel 102 is used for obtaining color information. Other components are the same as those in Embodiment 2. The description below will focus on differences from Embodiment 2 and description of overlapping points will be omitted.

As shown in FIG. 15B, the micro-lenses 103 are disposed so as to correspond to the respective pixels 102 on a one-to-one basis. Accordingly, of white light incident on the image capture element 500, light which is incident on each micro-spectroscopic element 101 and color separated is only light condensed by the micro-lens 103 situated immediately above a micro-spectroscopic element 101, and the other light is directly incident on the pixels immediately under the respective micro-lenses 103 via the respective micro-lenses 103.

Here, in the same manner as description of Embodiment 3, assuming that the intensity of white light incident on the single micro-lens 103 is denoted by W and the intensity of RGB three colors included in the white light is R, G, and B, respectively, light incident on pixels 102 $D_R$, $D_G$, and $D_B$ via five micro-lenses 103 is light having intensity represented by W+2R, G, and W+2B. Note that the above is one example, and depending on a configuration of each micro-spectroscopic element 101, the combination of the color components and propagation directions can be freely changed, and accordingly, the configuration of color components incident on respective pixels 102 $D_R$, $D_G$, and $D_B$ is also changed. In the following description, color information acquisition by matrix calculation when light having the intensity of W+2R, G, and W+2B is incident on the pixels 102 $D_R$, $D_G$, and $D_B$, respectively, is described, but it goes without saying that numerical values of matrix operators can be variously changed depending on the configuration and spectral performance of the micro-spectroscopic element 101.

The light having the intensity of W+2R, G, and W+2B incident on the respective pixels 102 goes through photoelectric conversion by the photoelectric conversion elements and is output as photoelectric conversion signals. Here, in the same manner as the description of Embodiment 3, photoelectric conversion signals corresponding to light intensity of the RGB three colors and white light W are denoted by $S_R$, $S_G$, $S_B$, and $S_W$, and photoelectric conversion signals output by the respective pixel 102 on which the light having the intensity of W+2R, G, and W+2B is incident are denoted by $S_{W+2R}$, $S_G$, and $S_{W+2B}$. Note that $S_W$ is represented by $S_W=S_R+S_G+S_B$, and $S_{W+2R}$ and $S_{W+2B}$ can be represented by relational formulas of $S_{W+2R}=S_W+2S_R$ and $S_{W+2B}=S_W+2S_B$, respectively. In addition, since the light incident on the pixel 102 $D_G$ is the component of G separated by the micro-spectroscopic element 101, $S_G$ is output as is.

From the above, $S_R$, $S_G$, and $S_B$ can be obtained by the following matrix calculation using $S_{W+2R}$, $S_G$, and $S_{W+2B}$.

[Expression 2]

$$\begin{pmatrix} 8S_R \\ 8S_G \\ 8S_B \end{pmatrix} = \begin{pmatrix} 3 & -2 & -1 \\ 0 & 8 & 0 \\ -1 & -2 & 3 \end{pmatrix} \begin{pmatrix} S_{W+2R} \\ S_G \\ S_{W+2B} \end{pmatrix} \qquad (3)$$

Therefore, by signal calculation using the three photoelectric conversion signals $S_{W+2R}$, $S_G$, and $S_{W+2B}$ output from the respective pixels $D_R$, $D_G$, and $D_B$, $S_R$, $S_G$, and $S_B$ which are intensity information on the three color components can be obtained.

From the above, also in the configuration of Embodiment 4, functions similar to those of Embodiment 2 can be implemented. Embodiment 4 is the same as Embodiment 2 other than the above-described differences from Embodiment 2, and the common components have the same effects as those described in Embodiment 2, and can be modified in the same manner. Note that in the modified example of using a combination with color filters, it is desirable that a color filter of a corresponding color component is disposed only above the pixel immediately under the micro-spectroscopic element 101.

Embodiment 1 to Embodiment 4 described above are merely preferred specific examples of the present invention, and the present invention is not limited to these and various modifications can be made.

In Embodiment 1 to Embodiment 4 described above, although the example is given in which SiN is assumed as the material of the micro-spectroscopic element 101, the present invention is not limited to this. For example, when the image capture element of the present invention is used in a visible light range where the wavelength of light is in a range of 380-800 nm, for materials for the micro-spectroscopic element, materials such as SiN, SiC, $TiO_2$, and GaN are suitable because they have a high refractive index and low absorption loss. For near infrared light whose wavelength is within a range of 800-1000 nm, as materials of low loss for the light, materials such as Si, SiC, SiN, $TiO_2$, GaAs, and GaN are suitable. For a near infrared region of a longer wavelength band (1.3 µm, 1.55 µm, or the like, which are communication wavelengths), InP or the like in addition to the above-described materials can be used. Furthermore, in the case of forming the micro-spectroscopic element by pasting or coating, polymers or the like such as polyimide such as fluorinated polyimide, PCB (bezocyclobutene), photo-curing resins, UV epoxy resins, acrylic resins such as PMMA, and resists in general are mentioned as materials.

In the same manner, in Embodiment 1 to Embodiment 4 described above, the example is given in which $SiO_2$ is assumed as the material of the transparent layer 111, the present invention is not limited to this. Any material, such as a general glass material, $SiO_2$, and an air layer may be used as long as its refractive index is lower than that of a micro-spectroscopic element material and it is low loss for the wavelength of incident light.

In Embodiment 1 to Embodiment 4 described above, although the case is described in which light of the three wavelength regions handled by the micro-spectroscopic element 101 is light of the three primary colors of red, green, and blue, at least one of the three wavelength regions may be light having a wavelength other than the three primary colors (for example, infrared light or ultraviolet light).

As mentioned above, although the present invention has been described based on the specific embodiments, the invention is not limited to the above embodiments, and it goes without saying that various changes can be made in a range without departing from the gist of the invention.

REFERENCE SIGNS LIST

1 Object
10 Image capture device
11 Lens optical system
12 Image capture element
13 Signal processing unit
100, 200, 300, 400, 500, 600, 610, 620 Image capture element
101 Micro-spectroscopic element
102 Pixel
103 Micro-lens
104 Color filter
111 Transparent layer
112 Wiring layer
121 Columnar structure
601 Wiring layer
602 Pixel
603 Transparent layer
604 Color filter
605 Micro-lens
606, 607 Microstructure

The invention claimed is:
1. A color image-capture element, comprising:
a two-dimensional pixel array in which a plurality of pixels each including a photoelectric conversion element are disposed on a substrate in a two-dimensional array;
a transparent layer formed on the two-dimensional pixel array; and
a two-dimensional spectroscopic element array in which a plurality of spectroscopic elements are disposed inside or on the transparent layer in a two-dimensional array,
wherein each of the spectroscopic elements includes a set of microstructures composed of a plurality of microstructures formed of a material having a higher refractive index than a refractive index of the transparent layer, wherein the set of microstructures is composed of the plurality of microstructures that have equal length in a direction perpendicular to the two-dimensional pixel array but have a different shape in a horizontal direction with respect to the two-dimensional pixel array, and are disposed at intervals equal to or shorter than a wavelength of incident light, wherein at least part of light incident on the spectroscopic elements is separated into first to third deflected lights that have different propagation directions according to their respective wavelengths, and the lights are emitted from the spectroscopic elements, and enter the three respective pixels disposed consecutively in one direction of the two-dimensional pixel array.

2. The color image-capture element according to claim 1, wherein each of the microstructures is a columnar structure, bottom and top surfaces of which structure have a shape of a four-fold rotational symmetry with a center as an axis of symmetry.

3. The color image-capture element according to claim 1, wherein the first to third deflected lights are incident on first to third photoelectric conversion elements of adjacent three consecutive pixels, respectively.

4. The color image-capture element according to claim 1, wherein when incident light is white light,
light incident on the first photoelectric conversion element has a light intensity peak in a blue wavelength region of 500 nm or less;
light incident on the second photoelectric conversion element has a light intensity peak in a green wavelength region from 500 nm to 600 nm; and
light incident on the third photoelectric conversion element has a light intensity peak in a red wavelength region of 600 nm or more.

5. The color image-capture element according to claim 1, wherein a shape of the set of microstructures is identical in all the spectroscopic elements included in the two-dimensional spectroscopic element array.

6. The color image-capture element according to claim 1, wherein:
a direction of the set of microstructures of the adjacent spectroscopic elements disposed along a first direction of the two-dimensional spectroscopic element array is alternately reversed;
adjacent three consecutive pixels are disposed along the first direction; and
on two pixels on outer sides among the three pixels adjacent along the first direction, any of the first to third deflected lights from the two spectroscopic elements adjacent along the first direction is incident.

7. The color image-capture element according to claim 1, further comprising, between the two-dimensional pixel array and the two-dimensional spectroscopic element array, a color filter array in which color filters of at least one type of:
a first color filter having a transmittance peak in a blue wavelength region of 500 nm or less;
a second color filter having a transmittance peak in a green wavelength region from 500 nm to 600 nm; and
a third color filter having a transmittance peak in a red wavelength region of 600 nm or more, are disposed in an array.

8. An image capture device, comprising:
the color image-capture element according to claim 1;
an image capture optical system for forming an optical image on an image capture surface of the color image-capture element: and
a signal processing unit that processes an electric signal output by the color image-capture element.

* * * * *